US012626176B2

(12) United States Patent
Harris

(10) Patent No.: US 12,626,176 B2
(45) Date of Patent: May 12, 2026

(54) SYSTEMS AND METHODS FOR SCALABLE QUANTUM COMPUTING

(71) Applicant: D-WAVE SYSTEMS INC., Burnaby (CA)

(72) Inventor: Richard G. Harris, North Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 762 days.

(21) Appl. No.: 17/913,548

(22) PCT Filed: Mar. 25, 2021

(86) PCT No.: PCT/US2021/024134
§ 371 (c)(1),
(2) Date: Sep. 22, 2022

(87) PCT Pub. No.: WO2021/195368
PCT Pub. Date: Sep. 30, 2021

(65) Prior Publication Data
US 2023/0106489 A1 Apr. 6, 2023

Related U.S. Application Data

(60) Provisional application No. 63/001,014, filed on Mar. 27, 2020.

(51) Int. Cl.
*G06N 10/40* (2022.01)
*H10N 60/12* (2023.01)
(52) U.S. Cl.
CPC ............. *G06N 10/40* (2022.01); *H10N 60/12* (2023.02)
(58) Field of Classification Search
USPC ....................................................... 716/100
See application file for complete search history.

(56) References Cited

U.S. PATENT DOCUMENTS

| | | | |
|---|---|---|---|
| 3,573,759 A | 4/1971 | Zimmerman et al. | |
| 4,028,714 A | 6/1977 | Henkels | |

(Continued)

FOREIGN PATENT DOCUMENTS

| | | |
|---|---|---|
| DE | 19511172 A1 | 10/1996 |
| EP | 0251568 A1 | 1/1988 |

(Continued)

OTHER PUBLICATIONS

Amin et al., "Current Biased Josephson Junction System," U.S. Appl. No. 60/557,747, filed Mar. 29, 2004, 49 pages.

(Continued)

*Primary Examiner* — Bryce M Aisaka
(74) *Attorney, Agent, or Firm* — Cozen O'Connor

(57) ABSTRACT

A superconducting circuit includes four superconducting qubits communicatively coupled by a 4-qubit even-parity stabilizer. The 4 -qubit even-parity stabilizer includes a superconducting stabilizer loop, and four inductances, each inductance inductively communicatively coupled to an inductance of a respective one of the four superconducting qubits. The 4-qubit even-parity stabilizer also includes a parity-enforcing super-conducting qubit communicatively coupled to the superconducting loop. A quantum processor comprises four Josephson parametric amplifiers communicatively coupled by a 4-qubit even-parity stabilizer. The Josephson parametric amplifiers comprise pairs of super-conducting microwave resonators communicatively coupled by a compound-compound Josephson junction. The 4-qubit even-parity stabilizer includes a superconducting loop, four inductances inductively communicatively coupled to an inductance of a respective one of the four Josephson parametric amplifier, and a parity-enforcing Josephson parametric amplifier communicatively coupled to the superconducting loop.

9 Claims, 7 Drawing Sheets

(56) References Cited

U.S. PATENT DOCUMENTS

| | | | |
|---|---|---|---|
| 4,504,926 A | 3/1985 | Toyoda |
| 4,769,753 A | 9/1988 | Knudson et al. |
| 4,956,642 A | 9/1990 | Harada |
| 5,162,731 A | 11/1992 | Fujimaki |
| 5,323,344 A | 6/1994 | Katayama et al. |
| 5,326,986 A | 7/1994 | Miller et al. |
| 5,329,165 A | 7/1994 | Kao et al. |
| 5,768,297 A | 6/1998 | Shor |
| 5,787,307 A | 7/1998 | Imoto |
| 5,869,846 A | 2/1999 | Higashino et al. |
| 5,917,322 A | 6/1999 | Gershenfeld et al. |
| 6,128,764 A | 10/2000 | Gottesman |
| 6,157,044 A | 12/2000 | Nakanishi et al. |
| 6,169,981 B1 | 1/2001 | Werbos |
| 6,317,766 B1 | 11/2001 | Grover |
| 6,360,112 B1 | 3/2002 | Mizuno et al. |
| 6,459,097 B1 | 10/2002 | Zagoskin |
| 6,495,854 B1 | 12/2002 | Newns et al. |
| 6,504,172 B2 | 1/2003 | Zagoskin et al. |
| 6,563,310 B2 | 5/2003 | Zagoskin |
| 6,563,311 B2 | 5/2003 | Zagoskin |
| 6,605,822 B1 | 8/2003 | Blais et al. |
| 6,614,047 B2 | 9/2003 | Tzalenchuk et al. |
| 6,627,915 B1 | 9/2003 | Ustinov et al. |
| 6,627,916 B2 | 9/2003 | Amin et al. |
| 6,633,053 B1 | 10/2003 | Jaeger |
| 6,649,929 B2 | 11/2003 | Newns et al. |
| 6,670,630 B2 | 12/2003 | Blais et al. |
| 6,728,131 B2 | 4/2004 | Ustinov |
| 6,753,546 B2 | 6/2004 | Tzalenchuk et al. |
| 6,803,599 B2 | 10/2004 | Amin et al. |
| 6,838,694 B2 | 1/2005 | Esteve et al. |
| 6,885,325 B2 | 4/2005 | Omelyanchouk et al. |
| 6,897,468 B2 | 5/2005 | Blais et al. |
| 6,900,454 B2 | 5/2005 | Blais et al. |
| 6,900,456 B2 | 5/2005 | Blais et al. |
| 6,911,664 B2 | 6/2005 | Il et al. |
| 6,919,579 B2 | 7/2005 | Amin et al. |
| 6,930,320 B2 | 8/2005 | Blais et al. |
| 6,936,841 B2 | 8/2005 | Amin et al. |
| 6,943,368 B2 | 9/2005 | Amin et al. |
| 6,960,780 B2 | 11/2005 | Blais et al. |
| 6,978,070 B1 | 12/2005 | Mccarthy et al. |
| 6,979,836 B2 | 12/2005 | Zagoskin et al. |
| 6,984,846 B2 | 1/2006 | Newns et al. |
| 7,002,174 B2 | 2/2006 | Il et al. |
| 7,015,499 B1 | 3/2006 | Zagoskin |
| 7,133,888 B2 | 11/2006 | Kohn et al. |
| 7,135,701 B2 | 11/2006 | Amin et al. |
| 7,230,266 B2 | 6/2007 | Hilton et al. |
| 7,253,654 B2 | 8/2007 | Amin |
| 7,307,275 B2 | 12/2007 | Lidar et al. |
| 7,335,909 B2 | 2/2008 | Amin et al. |
| 7,418,283 B2 | 8/2008 | Amin |
| 7,533,068 B2 | 5/2009 | Maassen et al. |
| 7,605,600 B2 | 10/2009 | Harris |
| 7,613,764 B1 | 11/2009 | Hilton et al. |
| 7,624,088 B2 | 11/2009 | Johnson et al. |
| 7,639,035 B2 | 12/2009 | Berkley |
| 7,843,209 B2 | 11/2010 | Berkley |
| 7,876,248 B2 | 1/2011 | Berkley et al. |
| 7,880,529 B2 | 2/2011 | Amin |
| 7,898,282 B2 | 3/2011 | Harris et al. |
| 8,008,942 B2 | 8/2011 | Van et al. |
| 8,018,244 B2 | 9/2011 | Berkley |
| 8,035,540 B2 | 10/2011 | Berkley et al. |
| 8,098,179 B2 | 1/2012 | Bunyk et al. |
| 8,102,185 B2 | 1/2012 | Johansson et al. |
| 8,169,231 B2 | 5/2012 | Berkley |
| 8,190,548 B2 | 5/2012 | Choi |
| 8,195,596 B2 | 6/2012 | Rose et al. |
| 8,421,053 B2 | 4/2013 | Bunyk et al. |
| 8,536,566 B2 | 9/2013 | Johansson et al. |
| 8,611,974 B2 | 12/2013 | Maibaum et al. |
| 8,644,898 B1 | 2/2014 | De Andrade et al. |
| 8,854,074 B2 | 10/2014 | Berkley |
| 8,951,808 B2 | 2/2015 | Ladizinsky et al. |
| 9,015,215 B2 | 4/2015 | Berkley et al. |
| 9,152,923 B2 | 10/2015 | Harris et al. |
| 9,495,644 B2 | 11/2016 | Chudak et al. |
| 9,870,277 B2 | 1/2018 | Berkley |
| 10,037,493 B2 | 7/2018 | Harris et al. |
| 10,068,180 B2 | 9/2018 | Amin et al. |
| 10,312,141 B2 | 6/2019 | Kirby et al. |
| 10,528,886 B2 | 1/2020 | Boothby |
| 10,552,755 B2 | 2/2020 | Lanting et al. |
| 10,938,346 B2 | 3/2021 | Berkley et al. |
| 11,127,893 B2 | 9/2021 | Johnson et al. |
| 11,182,230 B2 | 11/2021 | Berkley et al. |
| 11,424,521 B2 | 8/2022 | Whittaker et al. |
| 11,494,683 B2 | 11/2022 | Amin et al. |
| 2001/0020701 A1 | 9/2001 | Zagoskin |
| 2001/0023943 A1 | 9/2001 | Zagoskin |
| 2002/0060635 A1 | 5/2002 | Gupta |
| 2002/0117656 A1 | 8/2002 | Amin et al. |
| 2002/0179937 A1 | 12/2002 | Ivanov et al. |
| 2002/0180006 A1 | 12/2002 | Franz et al. |
| 2002/0188578 A1 | 12/2002 | Amin et al. |
| 2003/0016069 A1 | 1/2003 | Furuta et al. |
| 2003/0071258 A1 | 4/2003 | Zagoskin et al. |
| 2003/0111661 A1 | 6/2003 | Tzalenchuk et al. |
| 2003/0193097 A1 | 10/2003 | Il et al. |
| 2003/0207766 A1 | 11/2003 | Esteve et al. |
| 2003/0224944 A1 | 12/2003 | Il et al. |
| 2004/0000666 A1 | 1/2004 | Lidar et al. |
| 2004/0012407 A1 | 1/2004 | Amin et al. |
| 2004/0016918 A1 | 1/2004 | Amin et al. |
| 2004/0071019 A1 | 4/2004 | Magnus et al. |
| 2005/0047245 A1 | 3/2005 | Furuta et al. |
| 2005/0224784 A1 | 10/2005 | Amin et al. |
| 2006/0147154 A1 | 7/2006 | Thom et al. |
| 2008/0215850 A1 | 9/2008 | Berkley et al. |
| 2009/0322374 A1 | 12/2009 | Przybysz et al. |
| 2011/0057169 A1 | 3/2011 | Harris et al. |
| 2011/0060780 A1 | 3/2011 | Berkley et al. |
| 2012/0094838 A1 | 4/2012 | Bunyk et al. |
| 2012/0124432 A1 | 5/2012 | Pesetski et al. |
| 2014/0229722 A1 | 8/2014 | Harris |
| 2015/0032991 A1 | 1/2015 | Lanting et al. |
| 2015/0219730 A1 | 8/2015 | Tsukamoto et al. |
| 2015/0263736 A1 | 9/2015 | Herr et al. |
| 2016/0132785 A1 | 5/2016 | Amin et al. |
| 2016/0335558 A1 | 11/2016 | Bunyk et al. |
| 2017/0256698 A1 | 9/2017 | Nayfeh et al. |
| 2018/0054201 A1 | 2/2018 | Reagor et al. |
| 2018/0247217 A1 | 8/2018 | Heeres et al. |
| 2018/0314970 A1 | 11/2018 | Harris et al. |
| 2018/0341874 A1 | 11/2018 | Puri et al. |
| 2018/0342663 A1* | 11/2018 | Ferguson ............... G06N 10/40 |
| 2019/0019098 A1 | 1/2019 | Przybysz |
| 2019/0164959 A1 | 5/2019 | Thomas et al. |
| 2019/0237648 A1 | 8/2019 | Przybysz et al. |
| 2019/0392878 A1 | 12/2019 | Murduck et al. |
| 2020/0036332 A1 | 1/2020 | Abdo |
| 2020/0090738 A1 | 3/2020 | Naaman et al. |
| 2020/0320426 A1 | 10/2020 | Amin et al. |
| 2020/0401649 A1 | 12/2020 | Lanting |
| 2021/0013391 A1 | 1/2021 | Johnson et al. |
| 2021/0073667 A1 | 3/2021 | Harris |
| 2021/0190885 A1 | 6/2021 | Swenson et al. |
| 2021/0248506 A1 | 8/2021 | Hoskinson et al. |
| 2022/0020913 A1 | 1/2022 | Harris et al. |
| 2022/0123048 A1 | 4/2022 | Swenson et al. |
| 2023/0027682 A1 | 1/2023 | Molavi et al. |
| 2023/0106489 A1 | 4/2023 | Harris |
| 2023/0370069 A1 | 11/2023 | Amin et al. |

FOREIGN PATENT DOCUMENTS

| | | | |
|---|---|---|---|
| EP | 0916961 A2 | 5/1999 |
| EP | 1085422 A2 | 3/2001 |
| KR | 20190015330 A | 2/2019 |
| WO | 9612305 A1 | 4/1996 |
| WO | 03090161 A2 | 10/2003 |

(56) References Cited

FOREIGN PATENT DOCUMENTS

| WO | 03090161 A3 | 2/2005 |
|----|-------------|--------|
| WO | 2012064974 A2 | 5/2012 |
| WO | 2015013532 A1 | 1/2015 |
| WO | 2017192733 A2 | 11/2017 |
| WO | 2019126396 | 6/2019 |
| WO | 2021126875 A1 | 6/2021 |
| WO | 2022155140 A1 | 7/2022 |
| WO | 2023004040 A1 | 1/2023 |
| WO | 2023114811 A1 | 6/2023 |
| WO | 2023219656 A2 | 11/2023 |
| WO | 2024050333 A1 | 3/2024 |
| WO | 2024102504 A2 | 5/2024 |
| WO | 2024172854 A2 | 8/2024 |

OTHER PUBLICATIONS

Amin et al., "Degenerate Level Qubit Operations", U.S. Appl. No. 60/429,170, filed Nov. 25, 2002, 41 pages.
Ataldes, et al., "the XZZX surface code", Nature Communications, https://doi.org/10.1038/s41467-021-22274-1,. 2021, 12 pages.
Augar et al., "Fault-tolerance thresholds for the surface code with fabrication errors", Phys. Rev. A 96 042316—Published Oct. 12, 2017, 4 pages.
Averin et al., "Variable Electrostatic Transformer: Controllable Coupling of Two Charge Qubits," Physical Review Letters 91(5): 057003-1-057003-4, Aug. 1, 2003.
Averin, D.V., "Adiabatic Quantum Computation with Cooper Pairs," arXiv:quant-ph/9706026v1, Jun. 13, 1997, 18 pages.
Barrett, et al., "Fault Tolerant Quantum Computation with Very High Threshold for Loss Errors", Phys. Rev. Lett. 105, 200502—Published Nov. 9, 2010, 4 pages.
Blais et al., "Tunable Coupling of Superconducting Qubits," arXiv:cond-mat/0207112v3 [cond-mat.mes-hall], Mar. 18, 2003, 4 pages.
Blatter et al., "Design aspects of superconducting-phase quantum bits," Physical Review B 63: 174511-1-174511-9, 2001.
Bocko et al., "Prospects for Quantum Coherent Computation Using Superconducting Electronics," IEEE Transactions on Applied Superconductivity 7(2):3638-3641, Jun. 1997.
Brown, et al., "A fault-tolerant non-Clifford gate for the surface code in two dimensions", Science Advances, May 22, 2020, vol. 6, Issue 21, 25 pages.
Calderbank, et al., "Good quantum error-correcting codes exist", Phys. Rev. A54, 1098—Published Aug. 1, 2996, 4 pages.
Clarke et al., "Superconducting quantum bits," Nature 453:1031-1042, Jun. 19, 2008.
Devoret et al., "Superconducting Circuits for Quantum Information: An Outlook," Science 339:1169-1174, Mar. 8, 2013.
Devoret et al., "Superconducting Qubits: A Short Review," arXiv:cond-mat/0411174v1, Nov. 7, 2004, 41 pages.
Feynman, "Simulating Physics with Computers," International Journal of Theoretical Physics 21(6/7): 467-488, 1982.
Fowler, et al., "Surface codes: towards practical large-scale quantum computation", Phys. Rev. A 86, 032324—Published Sep. 18, 2012, 5 pages.
Friedman et al., "Aharonov-Casher-Effect Suppression of Macroscopic Tunneling of Magnetic Flux," arXiv:cond-mat/0109544v1 [cond-mat.mes-hall], Sep. 28, 2001, 9 pages.
Friedman et al., "Quantum superposition of distinct macroscopic states," Nature 406:43-46, Jul. 6, 2000.
Grajcar et al. "Parametric Amplification for Quantum State Readout," U.S. Appl. No. 60/557,750, filed Mar. 29, 2004, 51 pages.
Harris et al., "Experimental Demonstration of a Robust and Scalable Flux Qubit," arXiv:0909.4321v1, Sep. 24, 2009, 20 pages.
Hilton et al., "Bus Architecture for Quantum Processing", U.S. Appl. No. 60/556,778, filed Mar. 26, 2004, 40 pages.
Horsman, et al., "Surface code quantum computing by lattice surgery", 2012 Journal of Physics, 14 123011, 28 pages.

Il'ichev et al., "Characterization and Measurement of Superconducting Structures", U.S. Appl. No. 60/341,974, filed Dec. 18, 2001, 22 pages.
Il'ichev et al., "Extra-Substrate Control System", U.S. Appl. No. 60/372,958, filed Apr. 15, 2002, 29 pages.
Johnson et al., "Scalable Control System for a Superconducting Adiabatic Quantum Optimization Processor," Superconductor Science & Technology (2010).
Knill, Fault-Tolerant Postselected Quantum Computation: Schemes, arXiv:quant-ph/0402171v1, Feb. 23, 2004, 17 pages.
Makhlin et al., "Quantum-state engineering with Josephson-junction devices," Reviews of Modern Physics 73 (2):357-400, Apr. 2001.
Martinis, "Superconducting phase qubits," Quantum Inf Process 8:81-103, 2009.
Mooij et al., "Josephson Persistent—Current Qubit," Science 285:1036-1039, Aug. 13, 1999.
Naaman et al., "On-Chip Josephson Junction Microwave Switch," Northrop Grumman Systems Corp., Baltimore, Maryland, USA, Dec. 7, 2015, 10 pages.
Nagayama, et al., "Sureface code error correction on a defective lattice", IOP Publishing, New J. Phys. 19 (2017) 29 pages.
Non Final Office Action for U.S. Appl. No. 16/996,355, mailed Oct. 17, 2022, 12 pages.
Orlando et al., "Superconducting persistent-current qubit," Physical Review B 60(22):15398-15413, Dec. 1, 1999.
Tang, et al., "Robust surface code topology against sparse fabrication defects in a superconducting-qubit array", Phys. Rev. A 93. 032322—Published Mar. 15, 2018, 4 pages.
Venegas-Andraca, et al., "A cross-disciplinary introduction to quantum annealing-base algorithms", Contemporary Physics, Quantum Annealing ArXiv:1803.03372v1 [puant-ph] Mar. 9, 2018, 31 pages.
Wendin et al., "Superconducting Quantum Circuits, Qubits and Computing," arXiv:cond-mat/0508729v1 [cond-mat.supr-con], Aug. 30, 2005, 60 pages.
Zagoskin et al., "Two-Junction Phase Qubit", U.S. Appl. No. 60/349,663, filed Jan. 15, 2002, 21 pages.
Zagoskin et al., "Superconducting Qubits," La Physique au Canada 63(4):215-227, 2007.
Born , et al., "Fabrication of Ultrasmall Tunnel Junctions by Electron Beam Direct-Writing", IEEE, 2001, 4 pages.
Il'ichev et al., "Nonsinusoidal Current-Phase Relationship of Grain Boundary Josephson junctions in High-Tc Superconductors", Physical Review Letters 81, 1998, 4 pages.
Boothby et al., "Architectural considerations in the design of a third-generation superconducting quantum annealing processor", arXiv: 2108.02322v1, Aug. 2021, pp. 3-4; and figure 4.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
International Search Report and Written Opinion for PCT/US2022/081515 dated Jan. 18, 2024, 9 pages.
International Search Report and Written Opinion for PCT/US2023/073045 dated Jan. 9, 2024 in 9 pages.
Ko, et al., "A Novel Method for Correcting Device Parameter Mismatches in Josephsen Junction Circuits", IEEE Transitions on Applied Superconductivity, vol. 3, No. 1. Mar. 1993, 4 pages.
Aassime et al., "Radio-frequency Single-electron Transistor as Readout Device for Qubits: charge sensitivity and backaction", Phys Rev Lett 86, pp. 3376-3379, 2001.
Benatti et al., "Testing Macroscopic Quantum Coherence", Il Nuovo Cimento B 110, No. 5-6, pp. 593-610, 1995.
Briegel et al., "Quantum repreaters for Communication", arXiv. org:quant-ph/9803056, pp. 1-8 (1998), 1998.
Castellano et al., "A Squid Switch for a Macroscopic Quantum Coherence Experiment", Inst. Phys. Conf. Ser. No. 167, pp. 593-596 (2000).
Costabile et al., "rf-Induced steps in intermediate length Josephson-tunnel junctions", J Appl Phys 63, pp. 5406-5410 (1988), 1988.
De Bruyn Ouboter et al., "Multi-terminal SQUID controlled by the transport current", Physica B 205, pp. 153-162 (1995), 1995.

(56)         References Cited

OTHER PUBLICATIONS

Feldman et al., "Josephson Junctions Digital Circuits", FED Report, Feb. 1998, 22 pages.

Gotz et al., "Harmonic current-phase relation in Nb-A1-based superconductor/ normal conductor/ superconductor-type Josephson junctions betWeen 4.2 K and the critical temperature", ApplPhys. Lett. 77, pp. 1354-1356 (2000).

Greenberg et al., "Low-frequency characterization of quantum tunneling in flux qubits", ArXiv.org preprint server: cond-mat/0208076, last accessed on Aug. 20, 2004.

Grover, "A fast quantum mechanical algorithm for database search", Proceedings of the 28th Annual ACM Symposium on the Theory of Computing, pp. 212-219 (1996).

Il'ichev et al., "Characterization of superconducting structures designed for qubit realizations", Appl. Phys. Lett. 80, pp. 4184-4186, 2002.

Il'ichev et al., "Degenerate Ground State in a Mesoscopic YBa2Cu3O7-x Grain Boundary Josephson Junction", Phys. Rev. Lett. 86, pp. 5369-5372, 2001.

Il'ichev et al., "Radio-frequency based monitoring of small supercurrents", Rev. Sci. Instrum. 72, pp. 1882-1887, 2001.

Il'ichev et al., "Radio-frequency method for characterization of superconducting weak links," Physica C 350, pp. 244-248, 2001.

Il'ichev et al., "Temperature dependence of the current-phase relation for YBa2Cu3O7-x step-edge Josephson junctions", App. Phys. Lett. 72, pp. 731-733, 1998.

Ioffe et al., "Environmentally decoupled sds—Wave Josephson junctions for quantum computing", Nature 398, pp. 679-681 (1999).

Jones et al., "Implementation of a quantum search algorithm on a quantum computer", Nature 393, pp. 344-346 (1998).

Jonker et al., "On quantum and classical computing with arrays of superconducting persistent current qubits", Proceedings fifth IEEE International workshop on computer architectures for machine perception, Padova, italy, 11-13 Spe 2000, pp. 69-78.

Ketchen, "Integrated Thin Film dc-SQUID sensors", IEEE Transactions on Magnetics 23, pp. 1650-1657, 1987.

Kitaev et al., "Quantum measurements and the Abellan StabiliZer Problem", arXiv:quant-ph/9511026, pp. 1-22 (1995).

Knill et al., "Resilient Quantum Computation", Science 279, pp. 342-345 (1998).

Korotkov et al., "Charge Sensitivity of Radio-Frequency Single Electron Transistor", Appl. Phys Lett. 74, pp. 4052-4054 (1999).

Krech, "Linear Microwave Response of a Charge-Type Qubit", IEEE Trans. Appl. Supercond. 11, pp. 1022-1025, 2001.

Makhlin et al., "Nano-electronic circuits as quantum bits", ISACS 2000 Geneva. IEEE International Symposium on Circuits and Systems. Emerging Technologies of the 21st century Geneva, Switzerland, 28-32 Mar. 2000, pp. 241-244 vol. 2, Mar. 1, 2000.

Rey-de-Castro et al., "Design of an RSFQ Control Circuit to Observe MQC on an rf-SQUID", IEEE Transactions on Applied Superconductivity 11, pp. 1014-1017 (2001).

Rifkin et al., "rf SQUID's in the nonhysteretic mode: Detailed comparison of theory and experiment," J. App. Phys 47, pp. 2645-2650, 1976.

Schmidt et al., "Experimental investigations of the stationary behaviour of thin film double SQUIDS", Physica B&C Netherlands vol. 125B+C No. 2, Aug. 1984, pp. 185-198, Aug. 1, 1984.

Schoelkopf et al., "The Radio-Frequency Single-Electron Transistor (RF-SET): A Fast and Ultrasensitive Electrometer", Science 280, pp. 1238-1242 (1998).

Shor, "Polynominal-Time Algorithms for Prime Factorization and Discrete Logarithms on a Quantum Computer", SIAM Journal on Computing 26, pp. 1484-1509 (1997).

Silver et al., "Quantum States and Transitions in Weakly Connected Superconducting Rings", Phys. Rev 157, pp. 317-341, 1967.

Stolz et al., "LTS SQUID sensor with a new configuration," Supercon. Sci. Tech. 12, pp. 806-808, 1999.

Van der Wal et al., "Quantum Superposition of Macroscopic Persistent current states", Science 290, pp. 773-777, 2000.

Vandersypen et al., "Experimental realiZation of order—finding With a quantum computer", ArXiv.org:quant-ph/0007017, pp. 1-4 (2000).

Walraff et al., "Annular Long Josephson Junctions in a Magnetic Field: Engineering and Probing the Fluxon Interaction Potential", J. Low Temp. Phys. 118, pp. 543-553 (2000).

Xi et al., "Effects of Fields induced hole density modulation on normal state and superconducting transport in YBa2Cu3O7-x", Physical Review Letters, 68, pp. 1240-1243, 1992.

Zagoskin, "A scalable, tunable qubit, based on a clean DND or grain boundary D_D junction", Los Alamos National Laboratory preprint cond-mat/9903170, pp. 1-8, 1999.

Zahn, "Experimental Apparatus for the measurement if the quantum interferences of the critical current of DC-tunnel SQUIDs", Experimentelle technik der physik East Germany vol. 28, No. 2, 1980, pp. 163-168, 1980.

Zahn, "The critical current of the low damped DC-Squid", Experimentelle technik der physik East Germany vol. 31, No. 4, 1983, pp. 311-318, 1983.

Zhang et al., "Non-constant bias current for dc SQUID operation", Physica C 368, pp. 181-184, 2002.

Zhang et al., "Operation of high-temperature rf SQUID magnetometers using dielectric SrTiO3 resonators", App. Phys. Lett. 67, pp. 3183-3185, 1995.

Benjamin, "Schemes for Parallel Quantum Computation Without Local Control of Qubits", arXiv:quant-ph/99099007v2, Sep. 18, 1999, 12 pages.

Benjamin, Quantum Computing Without Local Control of Qubit-Qubit Interactions, 2001, 4 pages.

Bravyi, et al., "Hight-threshold and low-overhead fault-tolerant quantum memory", arXiv:2308.07915v1 [quant-ph] Aug. 15, 2023, 38 pages.

Bravyi, et al., "Universal quantum computation with ideal Clifford gates and noisy ancillas", arXiv:quant-ph/0403025v2 Dec. 16, 2004, 15 pages.

Carelli et al., "SQUID Systems for Macroscopic Quantum Coherence and Quantum Computing", IEEE trans. Apple. Supercond., Mar. 1, 2001. https://ieeexplore.ieee.org/document/919321.

Chamberland et al, "Building a Fault-Tolerant Quantum Computer Using Concatenated Cat Codes", arXiv:2012.04108v2 [quant-ph] Jan. 27, 2022,117 page.

Cosmelli et al, "An Integrated System of SQUIDs for the Study of Macroscopic Quantum Coherence", Supercond. Sci. Technol. 14, 2001.

Gottesman, et al., "Stabilizer Codes and Quantum Error Correction", arXiv:quant-ph/9705052v1, May 28, 1997, 122 pages.

Harris et al., 'A Compound Josephson Junction Coupler for Flux Qubits With Minimal Crosstalk', arXiv:0904.3784v3, Jul. 2009.

International Search Report and Written Opinion for PCT/US2022/012000 mailed Apr. 21, 2022, 11 pages.

Litinski, et al., "A Game of Surface Codes: Large-Scale Quantum Computing with Lattice Surgery", arXuv:1808.0289.02892v3 [quant=ph] Feb. 3, 2019, 37 pages.

Manucharyan, et al., "Fluxonium: single Cooper Pair circuit free of charge offsets", arXiv:0906.0831v2 [cond-mat.mes-hall] Oct. 20, 2009, 13 pages.

Mizuta, et al., "Quantum and Tunnelling Capacitance in Charge and Spin Qubits", arXiv:1604.02884v2 [cond-mat.mes-hall] Aug. 16, 2016, 9 pages.

Neill, "A path towards quantum supremacy with superconducting qubits", PhD Thesis—University of California, Dec. 1, 2017.

Neven, "Suppressing quantum errors by scaling a surface code logical qubit", arXiv:2207.06431v1 [quant-ph] Jul. 13, 2022, 44 pages.

Nguyen et al, "Scalable High-Performance Fluxonium Quantum Processor", arXiv:2201.09374v2 [quant-ph] Feb. 5, 2022, 29 pages.

Orlando et al, "Flux-based Superconducting Qubits for Quantum Computation" Physica C 372-376, 194-200, 2002.

Ortlepp et al., "Access Time and Power Dissipation of a Model 256-Bit Single Flux Quantum RAM", IEEE Transactions on Applied Superconductivity, vol. 24, No. 4, Aug. 2014.

(56) References Cited

OTHER PUBLICATIONS

Ortlepp et al., "Design Guidelines for Suzuki Stacks as Reliable High-speed Josephson Voltage Drivers", Superconductor Science Technology, 26 (2013) 035007 (12pp).

Raussendorf, et al., "Fault-Tolerant quantum computation with high threshold in two dimensions", arXiv:quant-ph/0610082v2, May 14, 2007, 4 pages.

Tokunaga et al., "SiO2 passivation film effects on YBCO junctions", Science Direct, Sep. 10, 1998.

Yamamoto, "Flux Driven Josephson Parametric Amplifier", arXiv:0808. 1386v1 [cond-mat.supr-con] 2008.

Yan et al., "A tunable coupling scheme for implementing high-fidelity two-qubit gates", Arxiv:1803.09813v1, Mar. 26, 2018.

Baust, Characterization of Flux-driven Josephson Parametric Amplifiers, Diploma Thesis, Technische Universitat Munchen, Aug. 2010, 119 pages.

Bell, et al., "Traveling Wave Parametric Amplifier based on a chain of Coupled Asymmetric SQUIDs", arXiv:1509.04573 [cond-mat.supr-con], Sep. 15, 2015.

Bell, et al, "SQUID Based Superconducting Traveling-Wave Parametric Amplifier", IEEE/CSC & ESAS Superconductivity News Forum (global edition), Oct. 2014, 3 pages.

Chamon, et al., "A superconducting circuit realization of combinatorial gauge symmetry", arXiv:2006.10060v1 [quant-ph] Jun. 17, 2020, 9 pages.

Chancellor et al., "Circuit design for multi-body interactions in superconducting quantum annealing systems with applications to a scalable architecture", arXiv:1603.09521v5, Oct. 13, 2017.

Christopher Eichler et al., 'Controlling the dynamic range of a Josephson parametric amplifier', EPJ Quantum Technology, vol. 1, No. 2, Jan. 29, 2014.

Devoret, "Josephson-based Parametric Amplifiers for Quantum Measurements", Quantum-Mechanical Electronics Lab, Applied Physics and Physics, Yale University, Nov. 9, 92 pages.

Devoret, et al., "Introduction to Quantum-limited parametric Amplification of Quantum Signals with Josephson Circuits", arXiv:1605. 00539v2, May 25, 2016, 28 pages.

Eddins, et al., "Josephson Parametric Amplifiers: Theory and Application", Quantum Nanoelectronics Laboratory, Department of Physics, University of CA, Berkley, Workshop on Microwave Cavity Design for Axion Detection Livermore Valley Open Campus, Aug. 2015.

Kitaev, "Fault-tolerant quantum computation by anyons", arXiv:quant-ph/9707021v1 Jul. 9, 1997, 27 pages.

Lechner et al., "A quantum annealing architecture with all-to-all connectivity from local interactions", Science Advances. Oct. 23, 2015. https://advances.sciencemag.org/content/1/9/e1500838.

Macklin, et al., "A near-quantum-limited Josephson traveling-wave parametric amplifier", Science Sciencemag. org,, Oct. 16, 2015, vol. 350, Issue 6258, 5 pages.

Puri, et al., "Quantum Annealing with All-to-all Connected Nonlinear Oscillators", Nature Communications, vol. 8, Article No. 15785, Jun. 8, 2017, 9 pages.

Sete, et al., "Purcell Effect with Microwave Drive: Suppression of Qubit Relaxation Rate", arXiv: 1401.5545v2, Mar. 21, 2014, 15 pages.

Simbierowicz, et al., "Flux-driven Josephson Parametric Amplifier for Sub-GHz Frequencies Fabricated with Side-wall Passivated Spacer Junction Technology", arXiv:1805.07307v1, May 18, 2018, 15 pages.

White et al., "Traveling wave parametric amplifier with Josephson junctions using minimal resonator phase matching", Applied Physics Letters 106, Jun. 15, 2015.

Zhao, et al. "Two-photon Driven Kerr Resonator for Quantum Annealing with Three-dimensional Circuit QED", arXiv:1712. 03613v2, Dec. 12, 2017, 13 pages.

Zhou, et al, "Experimental Realization of Spin Liquids in a Programmable Quantum Device", arXiv:2009.07853v2, 2020.

Abrams et al., "A quantum algorithm providing exponential speed increase for finding eigenvalues and eigenvectors," arXiv:quant-ph/ 9807070v1, Jul. 24, 1998, 9 pages.

Abrams et al., "Simulation of Many-Body Fermi Systems on a Universal Quantum Computer," arXiv:quant-ph/9703054, Mar. 28, 1997, 10 pages.

Alange et al., "Superconducting Material Diagnostics using a scanning Near-field Microwave Microscope", Los Alamos National Laboratory pre-print cond-met/9811158, pp. 1-6, 1998.

Alff et al, "Magnetic Field Effect three terminal device based on YBs2Cu3O7-x grain boundary junction", Journal of Applied Physics, 75, pp. 1843-1845, 1944.

Barenco et al., "Elementary gates for quantum computation," Physical Review A 52(5):3457-3467, Nov. 1995.

Beasley et al., "Time-reversal Symmetry breaking in superconductors: A proposed Experimental test", Physical Review B, 49, pp. 12330-12332, 1994.

Berkley et al., "Systems and Methods for Operating a Quantum Processor to Determine Energy Eigenvalues of a Hamiltonian," U.S. Appl. No. 61/832,645, filed Jun. 7, 2013, 51 pages.

Biamonte et al., "Realizable Hamiltonians for universal adiabatic quantum computers," arXiv:0704.1287v2, Jun. 17, 2008, 7 pages.

Blais et al., "Operation of universal gates in a solid-state quantum computer based on clean Josephson junctions between d-wave superconductors", Physical Review A, 61, 042308, 2000.

Blatter et al., "Engineering Superconducting Phase Qubits", Los Alamos National Laboratory pre-print cond-met/9912163, 1999.

Bravyi et al., "The Complexity of Stoquastic Local Hamiltonian Problems," arXiv:quant-ph/0606140v4, Oct. 2, 2007, 21 pages.

Chapman et al., "General Purpose Multiplexing Device for Cryogenic Microwave Systems," arXiv:1603.02716v2 [quant-ph] May 31, 2016, 10 pages.

Deutsch, "Quantum theory, the Church-Turing principle and the universal quantum computer," Appeared in Proceedings of the Royal Society of London A 400: 97-117, 1985.

Dimoulas et al., "Phase-dependent resistance in a superconductor two dimensional electron gas quasiparticle interferometer", Physical Review Letters, 74, pp. 602-605, 1995.

DiVincenzo, "The Physical Implementation of Quantum Computation," Fortschr. Phys. 48:771-783, 2000.

Flory et al., "Metallic and superconducting surfaces of YBa2Cu3O7 probrd by electrostatic charge modulation of epitaxial films", Physical Review Letters, 65, pp. 3441-3444, 1990.

Frey et al., "Mechanism of the electric field effect in the high Tc couprates", Physical Review B, 51, pp. 3257-3260, 1995.

Geim et al., "Ballistic Hall micromagnetometry", Applied Physics Letters, 71, pp. 2379-2381, 1997.

Han et al., "Time-Resolved Measurement of Dissipation-Induced Decoherence in a Josephson Junction," Science 293:1457-1459, Aug. 24, 2001.

Harris et al., "Universal Adiabatic Quantum Computing With Superconducting Qubits," U.S. Appl. No. 61/894,267, filed Oct. 22, 2013, 44 pages.

Hartog et al., "Transport in Multiterminal Normal Superconductor Devices: reciprocity relations, Negative and nonlocal resistances, and reentrance of the Proximity Effect", Physical Review Letters, 77, pp. 4954-4957, 1996.

International Search Report & Written Opinion (PCT/US2020/ 065150)—Apr. 13, 2021.

Ivanov et al., "Field effect transistor based on a bi-crystal boundary Josephson Junction", IEEE Transactions on Applied Superconductivity, 3, pp. 2925-2928, 1993.

Ivanov et al., "Three terminal Josephson Junction with a Semiconductor Accumulation Layer", Japanese Journal of Applied Physics, 26, supplement 3, pp. 1617, 1987.

James et al., "Scanning Hall probe Microscope images of Field penetration into niobium fields", Physica C 332, pp. 445-449, 2000.

Jiang et al., "New FET using the superconducting phase transition of a high temperature oxide superconductor", Superconductor Science and Technology, 4, pp. 466-470, 1991.

Jones et al., Tunable electromagnetic environment for supercomputing, Jun. 13, 2013, Scientific Reports, pp. 1-5 (Year:2013).

(56) References Cited

OTHER PUBLICATIONS

Kirtley et al., "Direct Imaging of Integer and Half-Integer Josephson Junction Vortices in High Tc Grain Boundaries", Physical Review Letters, 76, pp. 1336-1339, 1996.

Lombardi et al., "Transport and structural properties of the top and bottom grain boundaries on YBa2Cu3O7 step edge Josephson Junctions", Applied Physics Letters, 72, pp. 249-251, 1998.

Mannhart et al., "Anomalous dependence of the critical current of 45 grain boundaries in YBa2Cu3O7-x on an applied magnetic field", Zeitschrift fur Physik B, 101, pp. 175-179, 1996.

Mannhart et al., "High-Tc transistors", Superconductor Science and Technology, 9, pp. 49-67, 1996.

Mannhart et al., "Influence of electric fields on pinning in YBa2Cu3O7 films", Physical Review Letters, 67, pp. 2099-2101, 1991.

Mannhart et al., "Large electric field effetos in YBa2Cu3O7 films containing weak links", Applied Physics letters, 62, pp. 630-632, 1992.

Martinis et al., "Rabi Oscillations in a Large Josephson-Junction Qubit," Physical Review Letters 89(11):117901-1-117901-4, Sep. 9, 2002.

Nakajima et al., "Field Effects on the dielectric property of YBCO bicrystal grain boundary junctions", IEEE Transactions on Applied Superconductivity, 5, pp. 2861-2863, 1995.

Nakamura et al., "Coherent control of macroscopic quantum states in a single-Cooper-pair-box," Nature 398:786-788, Apr. 29, 1999.

Oral et al., "Microscopic measurements of penetration depth in YBa2Cu3O7-d thin films by scanning Hall probe microscopy", Superconductor Science and Technology 10, pp. 17-20, 1997.

Oral et al., "Real time scanning Hall probe microscopy", Applied Physics Letters, pp. 1324-1326, 1996.

Pechal et al., "Superconducting Switch for Fast On-Chip Routing of Quantum Microwave Fields," arXiv:1606.01031v1 [quant-ph] Jun. 3, 2016, 8 pages.

Tsuei et al., "Pairing symmetry in flux quantization in a tricrystal superconducting ring Yba2Cu3O7-delta", Physical Review Letters, 73, pp. 593-596, 1994.

Tzalenchuk et al., "SQUID and Hall-probe microscopy of superconducting films", IOP conference series 167, pp. 581-584, 2000.

Al-Saidi et al., "Eigenstates of a small Josephson junction coupled to a resonant cavity", Physical Review B, 65, pp. 014512-1 to 014512-7, 2001.

Armour et al., "Entangle ment and Decoherence of a Micromechanical Resonator via Coupling to a Cooper-Pair Box", Physical Review Letters, 88, pp. 148304-1 to 148301-4, 2002.

Averin et al., "Quantum Computing and Quantum Measurements With Mesoscopic Josephson Junctions", Fortschritte der Physik 48, pp. 1055-1074, 2000.

Barone et al., "Quantum Computation With Aharonov-Bohm Qubits", WWW.arXiv.org preprint: cond-mat/0203038 v1 (Mar. 2, 2002).

Blais et al., "Quantum netWork optimization", Physical Review A, 64, pp. 022312-1 to 022312-5 (2001).

Buisson et al., "Entangled states in a Josephson charge qubit coupled to a superconducting resonator", arXiv.org:cond/mat/0008275 (2000).

Burkard et al., "Spintronics and Quantum Dots for Quantum Computing and Quantum Communication," Fortschritte der Physik 48, pp. 965-986, 2000.

Cory et al., "NMR Based Quantum Information Processing: Achievements and Prospects", Fortschritte der Physik 48, pp. 875-907, 2000.

Cottet et al., "Implementation of a combined charge-phase quantum bit in a superconducting circuit", Physica C 367, pp. 197-203, 2002.

DiVincenzo et al., "Experimental Proposals for Quantum Computaton", H-K Lo and S.L. Braunstein (eds.), chapter 1, Wiley-VCH Verlag GmbH, Berlin (2001), also published WWW. ArXiv.org preprint: quant-ph/0002077 (Apr. 13, 2000).

Dykman, "Quantum Computing Using Electrons Floating on Liquid Helium", Fortschritte der Physik 48, pp. 1095 -1108, 2000.

Ettinger et al., "An Integrated 20 GHZ SiGe Bipolar Differential Oscillator With High Tuning Range".

Grangier et al., "Implementations of Quantum Computing Using Cavity Quantum Electrodynamics", Fortschritte der Physik 48, pp. 859-874, 2000.

Hekking et al., "Cooper Pair BOX Coupled to a Current-Biased Josephson Junction", arXiv.org:cond-mat/0201284 (2002).

Hu et al., "Decoherence and dephasing in spin-based solid state quantum computers", arXiv.org:cond-mat/0108339 (2001).

Joyez et al., "Observation of Parity-Induced Suppression of Josephson Tunneling in the Superconducting Single Electron Transistor", hysical Review Letters, 72(15)12458 2461, (1994).

Kane et al., "Silicon-based Quantum Computation", Fortschritte der Physik 48, pp. 1023-1041, 2000.

Kulik et al., "Quantum Computational Gates With Radiation Free Couplings", WWW.arXiv.org preprint1 cond-mat/0203313 v1 (Mar. 14, 2002).

Leggett et al., "Dynamics of the dissipative tWo-state system", RevieWs of Modern Physics, 59, pp. 1-85, 1987.

Lidar et al., "Quantum Codes for Simplifying Design and Suppressing Decoherence in Superconducting Phase-Qubits", Quant. Inf. Proc. 1, pp. 155-182, 2002.

Lidar et al., "Reducing Constraints on Quantum Computer Design by Encoded Selective Recoupling", Phys. Rev. Lett. 88, 017905, pp. 1-4, 2002.

Majer et al., "Simple phase bias for superconducting circuits", Applied Physics Letters 80 pp. 3638-3640, 2002.

Makhlin et al., "Josephson-Junction Qubits", Fortschritte der Physik 48, pp. 1043-1054, 2000.

Marquardt et al., "Superposition of tWo mesoscopically distinct quantum states: Coupling a Cooper-pair box to a large superconducting island", Physical Review B, 63, pp. 054514-054520 (2001).

Mooij et al., "Quantum superposition of macroscopic persistent-current states", Science, 290, pp. 773-777, 2000.

Olariu et al., "The quantum effects of electromagnetic fluxes," Rev. Mod. Phys. 57, pp. 339-436 and 13 pages of figures, 1987.

Orlando et al., "Engineering the Quantum Measurement Process for the Persistent Current Qubit", Physica C 3681294-299 (Mar. 2002).

Plastina et al. "Communicating Josephson qubits", arXiv.org:cond-mat/0206586 (2002).

Poyatos et al., "Schemes of Quantum Computations With Trapped Ions", Fortschritte der Physik 48, pp. 785-799, 2000.

Rifkin et al., "Current-Phase relation and phase-dependent conductance of superconducting point contacts from rf impedance measurements", Phys. Rev. ]313894-3901 (1976).

Schmidt, "The Physics of Superconductors", P. Muller and AV. Ustinov (Eds.), Springer, 1997, chapter 4.

Shnirman et al., "Quantum measurements performed With a single-electron transistor", Phys. Rev. B 57(24) 115400-15407 (1998).

Spiller et al., "Superconducting Circuits for Quantum Computing," Fortschritte der Physik 48, pp. 1075-1094, 2000.

Tanaka et al., "DC SQUID Readout Readout for Qubit," Physica C, 3681300 304 (Mar. 2002).

Vion et al., "Manipulating the quantum state of an electrical circuit", Science, 296, pp. 886-889 (2002).

Yu et al., "Coherent temporal oscillations of macroscopic quantum states in a Josephson junction", Science, 296, pp. 889-892, 2002.

Zhang et al., "Substrate resonator for HTS rf SQUID operation", Physica C 372-3761282-286 (2002).

Zorin, "Quantum-Limited Electrometer Based on Single Cooper Pair Tunneling", Phys. Rev. Lett. 76, pp. 4408-4411, 1996.

Zorin, "Radio-Frequency Bloch-Transistor Electrometer", Phys. Rev. Lett. 86, pp. 3388-3391, 2001.

Zurek, "Decoherence and the transition from quantum to classical", Physics Today, 44, 10, pp. 36-44, 1991.

Watanabe, M. et al., "Resonance-Free Low-Pass Filters for the AC Josephson Voltage Standard," IEEE Transactions on Applied Superconductivity, 16(1), Mar. 2006, 5 pages.

Allman, et al., "RFSQUID-Mediated Coherent Tunable Coupling Between a Superconducting Phase Qubit and a Lumped Element Resonator", arXiv:1001.0816v1 [cond-mat.supr-con], Jan. 6, 2010.

Amin et al., "Thermally assisted adiabatic quantum computation," arXiv:cond-mat/0609332v2, pp. 1-5, (Mar. 2, 2007) Feb. 1, 2006.

(56) References Cited

OTHER PUBLICATIONS

Amin, "Effect of Local Minima on Adiabatic Quantum Optimization," arXiv:0709.0528v2, Apr. 4, 2008., https://arxiv.org/abs/0709.0528v2.

Anton, et al., "Magnetic Flux Noise in dc SQUIDs: Temperature and Geometry Dependence", Physical Review Letters, PRL 110, 147002, Apr. 5, 2013.

Auger James M. Fault-tolerance thresholds for the surface code with fabrication errors, arXiv:1706.04912v1, Jun. 15, 2017.

Barends, et al., Logic Gates at the Surface Code Threshold: Superconducting Qubits Poised for Fault-tolerant Quantum Computing, 2014, arXiv:1402.4848.

Blais, et al., "Cavity quantum electrodynamics for superconducting electrical circuits" an architecture for quantum computation, arXiv:cond-mat/0402216v1, Feb. 7, 2004, pp. 1-14 (Year:2004).

Brennen et al., "Why should anyone care about computing with anyons?," arXiv:0704.2241v1 [quant-ph], pp. 1-12, Apr. 18, 2007.

Chancellor, et al., "Scalable Universal Holonomic Quantum Computation Realized with an Adiabatic Quantum Data Bus and Potential Implementation Using Superconducting Flux Qubits", arXiv:1301.7100v3 [quant-ph], Mar. 21, 2013, 10 pages.

Chow, et al., "Complete Universal Quantum Gate Set Approaching Fault-tolerant Thresholds with Superconducting Qubits", arXiv:1202.5344v1 [quant-ph], Feb. 23, 2012, 13 pages., Control Systems bucket—new refs Re: IDF 13022, 14020, 14028, and 14030.

Clarke et al., "Quiet Readout of Superconducting Flux States," Physica Scripta. T102: 173-177, 2002.

Cosmelli, C., "Controllable Flux Coupling for the Integration of Flux Qubits," arXiv:cond-mat/0403690v1 [cond-mat.supr-con]. Mar. 29, 2004, 10 pages.

Devitt, Quantum Error Correction for Beginners, arXiv: 0905.2794v4 [quant-ph], Jun. 21, 2013 2013.

Economist, Quantum Dreams, Economist, pp. 1-3 (Mar. 8, 2001).

Farhi et al., "Quantum Adiabatic Evolution Algorithms versus Simulated Annealing," MIT-CTP #3228, arXiv:quant-ph/0201031 v1, pp. 1-16, Jan. 8, 2002.

Filippov et al., "Tunable Transformer for Qubits Based on Flux States," IEEE Transactions on Applied Superconductivity 13(2): 1-4, Jun. 2003.

Geerlings, et al., "Improving the Quality Factor of Microwave Compact Resonators by Optimizing Their Geometrical Parameters", arXiv:1204.0742v3 [cond-mat.supr-con], Jun. 5, 2012.

Ghiu et al., "Asymmetric two-output quantum processor in any dimension," arXiv:quant-ph/0610138v1, pp. 1-8, Oct. 17, 2006.

Harris et al., "A Compound Josephson Junction Coupler for Flux Qubits With Minimal Crosstalk," arXiv:0904.3784v3 [cond-mat.supr-con], Jul. 16, 2009, 5 pages.

Harris et al., "Experimental Investigation of an Eight-Qubit Unit Cell in a Superconducting Optimization Processor," arXiv:1004.1628v2, Jun. 28, 2010, 16 pages.

Harris, Sign and Magnitude Tunable Coupler for Superconducting Flux Qubits, arXiv:cond-mat/0608253v1, Aug. 11, 2006 2006.

Hofheinz, et al., "Generation of Fock States in a Superconducting Quantum Circuit", Nature 454, pp. 310-314, Jul. 1, 2008.

Hofheinz, et al., "Synthesizing Arbitrary Quantum Staes in a Superconducting Resonator, Nature", vol. 459, pp. 546-549, May 28, 2009.

Ilichev, et al., "Continuous Monitoring of Rabi Oscillations in a Josephson Flux Qubit", Physical Review Letters 91(9): 097906-1-097906-4, week ending Aug. 19, 2003.

Johnson, et al; "A scalable control system for a superconducting adiabatic quantum optimization processor", Superconductor Science and Technology; IOP Publishing; Supercond. Sci. Technol. 23 (2010); vol. 23, No. 6, Jun. 1, 2010, 12 pages.

Jordan, et al., "Perturbative Gadgets at Arbitrary Orders", arXiv:0802.1874v4 [quant-ph], Jan. 31, 2012.

Kjaergaard et al., "Superconducting Qubits: Current State of Play", arXiv:1905.13641v1, May 31, 2019.

Knill , QCThresholdAnalysis 2004.

LaForestFlux-vector Model of Spin Noise in Superconducting Circuits: Electron Versus Nuclear Spins and Role of Phase Transition, arXiv: 1501.03776v3 [cond-mat.supr-con], Jul. 21, 2015 2015.

Lanting, Evidence for Temperature Dependent Spin-diffusion as a Mechanism of Intrinsic Flux Noise in SQUIDs, arXiv: 1306.1512v3 [cond-mat.supr-con], Dec. 23, 2013.

Levitov, et al., "Quantum Spin Chains and Majorana States in Arrays of Coupled Qubits," arXiv:cond-mat/0108266v2 [cond-mat.mes-hall]. Aug. 19, 2001, 7 pages.

Lidar , Towards Fault Tolerant Adiabatic Quantum Computation, arXiv: 0707.0021v3 [quant-ph], May 2, 2008.

Mc Hugh et al., "A quantum computer using a trapped-ion spin molecule and microwave radiation," arXiv:quant-ph/0310015v2, pp. 1-9, Apr. 13, 2004.

Paik, et al., "Observation of High Coherence in Josephson Junction Qubits Measured in a Three-dimensional Circuit QED Architecture", arXiv:1105.4652v4 [quant-ph], Nov. 2, 2011.

Pop, et al., "Experimental Demonstration of Aharonov-Casher Interference in a Josephson Junction Circuit", arXiv:1104.3999v1 [cond-mat.mess-hall], Apr. 20, 2011.

Rocchetto et al., "Stabilisers as a design tool for new forms of Lechner-Hauke-Zoller Annealer", arXiv:1603.08554 [quant-ph], May 2, 2016. https://arxiv.org/abs/1603.08554.

Sendelbach, et al., "Complex Inductance, Excess Noise, and Surface Magnetism in dc SQUIDs", Physical Review Letters 103, 117001, Sep. 11, 2009.

VanDenBrink Mediated Tunable Coupling of Flux Qubits, New Journal of Physics 7 (2005) 230, Nov. 7, 2005.

Venturelli et al., Quantum Optimization of Fully-Connected Spin Glasses, arXiv:1406.7553v1 [cond-mat.dis-nn], Jun. 29, 2014.

Wang, et al., "Measurement of the Decay of Fock States in a Superconducting Quantum Circuit", arXiv:0808.3279v1 [cond-mat.mess-hall], Aug. 24, 2008.

Wenner, et al., "Catching Time-Reversed Microwave Photons with 99.4% Absorption Efficiency", arXiv:1311.1180v2 [quant-ph], Nov. 16, 2013.

Yin, et al., "Controlled Catch and Release of Microwave Photon States", arXiv:1208.2950v1 [cond-mat.supr-con], Aug. 14, 2012.

Zagoskin—Superconducting Qubits, La Physique au Canada 63(4):215-227, 2007.

Semenov, et al., Semenov, et al., "Classical and Quantum Operation Modes of the Reversible Logic Circuits," Department of Physics and Astronomy, Stony Brook University, Stony Brook, New York, Presentation, Dec. 2006, 29 pages.

Wang, et al., "Quantum state characterization of a fast tunable superconducting resonator," Applied Physics Letters 102, 163503 (2013), 4 pages.

Castellanos-Beltran, "A widely tunable parametric amplifier based on a SQUID array resonator", arXiv:0706.2373v1 [cond-mat.supr-con], Jun. 15, 2007.

* cited by examiner

SYSTEMS AND METHODS FOR SCALABLE QUANTUM COMPUTING

FIELD

This disclosure generally relates to systems and methods for scalable quantum computing, and, in particular, circuits for providing control and communicative coupling between devices.

BACKGROUND

Superconducting Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in U.S. Pat. Nos. 7,533,068, 8,195,596, 8,190, 548, and PCT Patent Application Serial No. PCT/US2009/037984.

A superconducting processor may be a processor that is not intended for quantum computing, and operates, for example, by principles that govern the operation of classical computer processors.

A computing system may in general include a quantum processor and/or a classical processor. A computing system may be a hybrid system that includes a quantum processor and a classical processor. In some implementations, at least one of the quantum processor and the classical processor is a superconducting processor.

Superconducting Qubits

A superconducting quantum processor may include superconducting qubits. Superconducting qubits may be formed in a superconducting integrated circuit from superconducting material (e.g., aluminum and/or niobium).

Superconducting qubits may be categorized by a physical property used to encode information in the qubits. For example, superconducting qubits may be categorized into charge, flux, and phase qubits. Charge qubits can store and manipulate information in charge states of the qubit. Flux qubits can store and manipulate information in a variable related to a magnetic flux through a portion of the qubit. Phase qubits can store and manipulate information in a variable related to a difference in a superconducting phase between two regions of the qubit. Hybrid devices can use two or more of charge, flux and phase degrees of freedom.

Superconducting qubits commonly include at least one Josephson junction. A Josephson junction is a small interruption in an otherwise continuous superconducting current path and is typically realized by a thin insulating barrier sandwiched between two superconducting electrodes. A Josephson junction can be formed as a three-layer or "trilayer" structure. Superconducting qubits are further described in, for example, U.S. Pat. Nos. 7,876,248, 8,035, 540, and 8,098,179.

Some implementations of superconducting flux qubits include a superconducting loop (also referred to in the present application as a qubit loop) that is interrupted by at least one Josephson junction. Some implementations include multiple superconducting loops connected in series and/or in parallel with one another. Some implementations include multiple Josephson junctions connected either in series or in parallel with one another.

A pair of Josephson junctions that are connected in parallel with each another is referred to as a compound Josephson junction (CJJ). It is understood that the behavior of a CJJ may be modeled as a single effective Josephson junction, similar to the way in which the behavior of multiple resistors connected in parallel with one another may be modeled as a single effective resistance.

A compound Josephson junction in which at least one of the constituent Josephson junctions is itself a compound Josephson junction is referred to in the present application as a compound-compound Josephson junction (CCJJ).

Hamiltonian Description of a Quantum Processor

In accordance with some implementations of the present systems and devices, a quantum processor may be designed to perform adiabatic quantum computation and/or quantum annealing. A common problem Hamiltonian includes a first component proportional to diagonal single-qubit terms and a second component proportional to diagonal multi-qubit terms, and may be expressed, for example, as follows:

$$H_P \propto -\frac{\varepsilon}{2}\left[\sum_{i=1}^{N} h_i \sigma_i^z + \sum_{j>i}^{N} J_{ij}\sigma_i^z\sigma_j^z\right]$$

where N represents the number of qubits, $\sigma_i^z$ is a Pauli z-matrix for the $i^{th}$ qubit, $h_i$ and $J_{ij}$ are dimensionless local fields for the qubits and couplings between qubits, respectively, and E is a characteristic energy scale for $H_P$.

The term $\sigma_i^z$ is an example of a diagonal single-qubit term, and the term $\sigma_i^z\sigma_j^z$ is an example of a diagonal two-qubit term. A Hamiltonian may be physically realized by an implementation of superconducting qubits, for example.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

A superconducting circuit may be summarized as comprising a Josephson parametric amplifier, the Josephson parametric amplifier comprising a pair of superconducting resonators; a compound-compound Josephson junction, the compound-compound Josephson junction superconductingly electrically communicatively coupled between the pair of superconducting resonators; and a first control circuit, wherein the first control circuit is communicatively coupled to the compound-compound Josephson junction.

In some implementations, the first control circuit is inductively communicatively coupled to the compound-compound Josephson junction.

In some implementations, the first control circuit comprises an analog DC current bias, the analog DC current bias communicatively coupled to the compound-compound Josephson junction of the Josephson parametric amplifier; a digital-to-analog converter (DAC), the DAC communicatively coupled to the compound-compound Josephson junction of the Josephson parametric amplifier; and a first microwave drive communicatively coupled to a first tunable mutual inductance, wherein the first tunable mutual inductance is communicatively coupled to the compound-compound Josephson junction of the Josephson parametric amplifier. In some implementations, the first tunable mutual inductance of the first control circuit is inductively communicatively communicatively coupled to the compound-compound Josephson junction of the Josephson parametric amplifier. In some implementations, the analog DC current bias and the DAC of the first control circuit are inductively communicatively coupled to the compound-compound Josephson junction of the Josephson parametric amplifier. In some implementations, the first tunable mutual inductance comprises a superconducting loop interrupted by a compound Josephson junction.

In some implementations, the first control circuit is operable to control strengths of X-terms and Z-terms of an effective Hamiltonian via a resonant drive at a first angular frequency, and via a parametric drive at a second angular frequency, the second angular frequency equal to a difference between twice the first angular frequency and a time-dependent de-tuning frequency.

In some implementations, the superconducting circuit further comprising a second control circuit, the second control circuit comprising a second microwave drive communicatively coupled to a second tunable mutual inductance, wherein the second tunable mutual inductance is communicatively coupled to the compound-compound Josephson junction of the Josephson parametric amplifier. In some implementations, the second control circuit is inductively communicatively coupled to the compound-compound Josephson junction. In some implementations, the second tunable mutual inductance of the second control circuit is inductively communicatively coupled to the compound-compound Josephson junction of the Josephson parametric amplifier. In some implementations, the second tunable mutual inductance comprises a superconducting loop interrupted by a compound Josephson junction.

In some implementations, each resonator of the pair of superconducting resonators is a superconducting microwave resonator. In some implementations, the superconducting microwave resonator is a coaxial transmission line resonator. In some implementations, the superconducting microwave resonator is a ladder circuit comprising a plurality of LC circuits electrically communicatively coupled in series with one another.

A method of operation of a hybrid computing system may be summarized as comprising a digital processor and a superconducting circuit, the superconducting circuit comprising at least one Josephson parametric amplifier, a resonant drive, and a parametric drive, the method comprising setting by the digital processor a first angular frequency of the resonant drive; setting by the digital processor a second angular frequency of the parametric drive, the second angular frequency equal to a difference between twice the first angular frequency and a de-tuning frequency; and controlling by the digital processor a strength of an X-term and a Z-term of an effective Hamiltonian of the superconducting circuit by varying the de-tuning frequency.

A superconducting circuit may be summarized as comprising a first, a second, a third, and a fourth superconducting qubit, wherein the first, the second, the third, and the fourth qubits are communicatively coupled by a 4-qubit even-parity stabilizer. In some implementations, the 4-qubit even-parity stabilizer comprises a superconducting stabilizer loop, the superconducting stabilizer loop which includes a material that is superconducting at or below a first critical temperature; a first inductance of the superconducting stabilizer loop, the first inductance inductively communicatively coupled to an inductance of the first superconducting qubit; a second inductance of the superconducting stabilizer loop, the second inductance inductively communicatively coupled to an inductance of the second superconducting qubit; a third inductance of the superconducting stabilizer loop, the third inductance inductively communicatively coupled to an inductance of the third superconducting qubit; a fourth inductance of the superconducting stabilizer loop, the fourth inductance inductively communicatively coupled to an inductance of the fourth superconducting qubit; and a parity-enforcing superconducting qubit, wherein the parity-enforcing qubit is communicatively coupled to the superconducting loop.

In some implementations, each of the first, the second, the third, the fourth, and the parity-enforcing superconducting qubits is a superconducting flux qubit. In some implementations, each of the first, the second, the third, and the fourth superconducting flux qubits includes a respective compound-compound Josephson junction. In some implementations, each of the first, the second, the third, and the fourth superconducting flux qubits comprises a respective superconducting qubit loop, the respective superconducting qubit loop which includes a material that is superconducting at or below a second critical temperature, each superconducting qubit loop comprising a respective crossover. In some implementations, the parity-enforcing superconducting flux qubit is communicatively coupled to the superconducting loop by a fully galvanic CJJ coupling device.

A quantum processor may be summarized as comprising a first, a second, a third, and a fourth Josephson parametric amplifier, wherein the first, the second, the third, and the fourth parametric amplifiers are communicatively coupled to one another by a 4-qubit even-parity stabilizer. In some implementations, each of the first, the second, the third, and the fourth Josephson parametric amplifiers comprises a respective pair of superconducting microwave resonators, each superconducting microwave resonator of the respective pair of superconducting microwave resonators communicatively coupled to each other by a compound-compound Josephson junction. In some implementations, the 4-qubit even-parity stabilizer includes a superconducting loop, the superconducting loop which includes a material that is superconducting at or below a critical temperature, the superconducting loop which includes a crossover; a first, a second, a third, and a fourth inductance of the superconducting loop, each of the first, the second, the third, and the fourth inductance inductively communicatively coupled to an inductance of a respective Josephson parametric amplifier; and a parity-enforcing Josephson parametric amplifier, wherein the parity-enforcing Josephson parametric amplifier is communicatively coupled to the superconducting loop. In some implementations, each of the first, the second, the third and the fourth Josephson parametric amplifiers comprises a respective compound-compound Josephson junction, and a respective first control circuit communicatively coupled to the respective compound-compound Josephson junction of the first, the second, the third and the fourth Josephson parametric amplifiers. Each respective first control circuit may be inductively communicatively coupled to the respective compound-compound Josephson junction of the first, the second, the third and the fourth Josephson parametric amplifiers. Each respective first control circuit may comprise an analog DC current bias, communicatively coupled to the respective compound-compound Josephson junction of the first, the second, the third and the fourth Josephson parametric amplifiers, a digital-to-analog converter (DAC) communicatively coupled to the respective compound-compound Josephson junction of the first, the second, the third and the fourth Josephson parametric amplifiers, and a respective first microwave drive communicatively coupled to a respective first tunable mutual inductance communicatively coupled to the respective compound-compound Josephson junction of the first, the second, the third and the fourth Josephson parametric amplifiers. The respective first tunable mutual inductance of each of the respective first control circuit may be inductively communicatively coupled to the respective compound-compound Josephson junction of the first, the second, the third and the fourth Josephson parametric amplifiers. Each of the analog DC current bias and each of the DAC of the respective first control circuit may be inductively communicatively coupled to the respective compound-compound Josephson junction of the first, the second, the third and the fourth Josephson parametric amplifiers. Each of the respective first tunable mutual inductances may comprise a superconducting loop interrupted by a compound Josephson junction. Each respective first control circuit may be operable to control strengths of X-terms and Z-terms of an effective Hamiltonian via a resonant drive at a first angular frequency, and via a parametric drive at a second angular frequency, the second angular frequency equal to a difference between twice the first angular frequency and a time-dependent de-tuning frequency. Each of the first, the second, the third and the fourth Josephson parametric amplifiers may further comprise a respective second control circuit, each respective second control circuit comprising a respective second microwave drive communicatively coupled to a respective second tunable mutual inductance, wherein each respective second tunable mutual inductance is communicatively coupled to the respective compound-compound Josephson junction of the first, the second, the third and the fourth Josephson parametric amplifiers. Each respective second control circuit may be inductively communicatively coupled to the respective compound-compound Josephson junction of the first, the second, the third and the fourth Josephson parametric amplifiers. Each respective second tunable mutual inductance of the respective second control circuit may be inductively communicatively coupled to the respective compound-compound Josephson junction of the first, the second, the third and the fourth Josephson parametric amplifiers. Each respective second tunable mutual inductance may comprise a superconducting loop interrupted by a compound Josephson junction. Each resonator of the respective pair of superconducting resonators of the first, the second, the third, and the fourth Josephson parametric amplifiers may be a superconducting microwave resonator. Each of the superconducting microwave resonators in the respective pair of superconducting resonators of the first, the second, the third, and the fourth Josephson parametric amplifiers may be a coaxial transmission line resonator. Each superconducting microwave resonator in the respective pair of superconducting resonators of the first, the second, the third, and the fourth Josephson parametric amplifiers may be a ladder circuit comprising a plurality of LC circuits electrically communicatively coupled in series with one another.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Scalable Coupling

Multi-qubit interactions can include 2-local interactions. Multi-qubit interactions can also include k-local interactions where k>2.

One architecture suitable for quantum annealing is described, for example, in Lechner W. et al., A QUANTUM ANNEALING ARCHITECTURE WITH ALL-TO-ALL CONNECTIVITY FROM LOCAL INTERACTIONS, Sci. Adv. 2015;1:e1500838 (referred to in the present application variously as the LHZ architecture and the LHZ scheme). Direct implementation of a 4-local coupling device (e.g., a nonlinear coupling device providing communicative coupling between four logical qubits) may be challenging. For example, an act of tuning qubit interactions using the 4-local coupling device may prove to be difficult, and a magnitude of interaction energies achievable in practice may be weaker than desired.

One approach to implementing a 4-qubit even-parity stabilizer is to use one or more auxiliary qubits. A search over a space of discretized 2-local couplings and 1-local biases can reveal configurations that result in eight possible even-parity logical qubit states being degenerate ground states.

Figure 1A:
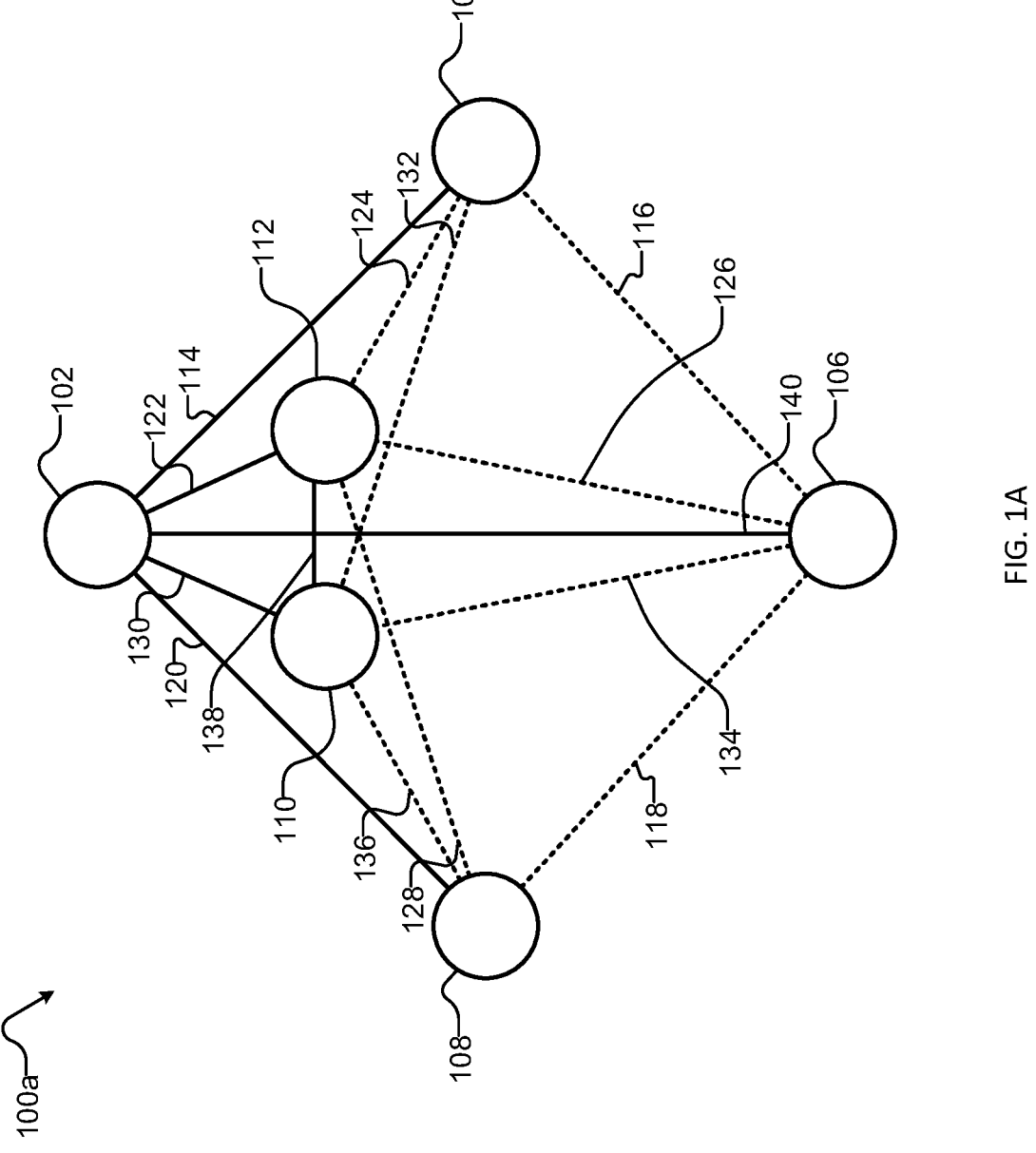
FIG. 1A is a schematic diagram of an example implementation of a 4-qubit even-parity stabilizer.

FIG. 1A is a schematic diagram of an example implementation of a 4-qubit even-parity stabilizer 100a. Stabilizer 100a is an example configuration of a 6-qubit implementation of a 4-qubit even-parity stabilizer.

Stabilizer 100a includes four logical qubits 102, 104, 106, and 108. In some implementations, a logical qubit (e.g., one of logical qubits 102, 104, 106, and 108) includes more than one physical qubit and at least one communicative coupling device between physical qubits.

Stabilizer 100a includes two auxiliary qubits 110 and 112. Auxiliary qubits 110 and 112 can contribute to enforcing even parity.

Stabilizer 100a can be implemented using 2-local interactions that are either +1 or −1. An energy spacing between the 8-fold degenerate ground states and the first excited state can take the value 2, for example.

In FIG. 1A, ferromagnetic couplings between qubits are indicated by solid lines, and anti-ferromagnetic couplings between qubits are indicated by dashed lines.

Stabilizer 100a includes a ferromagnetic (FM) coupling 114 between logical qubits 102 and 104, anti-ferromagnetic (AFM) couplings 116 and 118 between logical qubits 104 and 106, and 106 and 108, respectively, and an FM coupling 120 between logical qubits 108 and 102. Stabilizer 100a includes an FM coupling 122 between auxiliary qubit 112 and logical qubit 102, and AFM couplings 124, 126, and 128 between auxiliary qubit 112 and each of logical qubits 104, 106, and 108, respectively. Stabilizer 100a includes an FM coupling 130 between auxiliary qubit 110 and logical qubit 102, and AFM couplings 132, 134, and 136 between auxiliary qubit 110 and each of logical qubits 104, 106, and 108, respectively. Stabilizer 100a also includes an FM coupling 138 between auxiliary qubits 110 and 112. Stabilizer 100a also includes an FM coupling 140 between logical qubits 102 and 106.

Figure 1B:
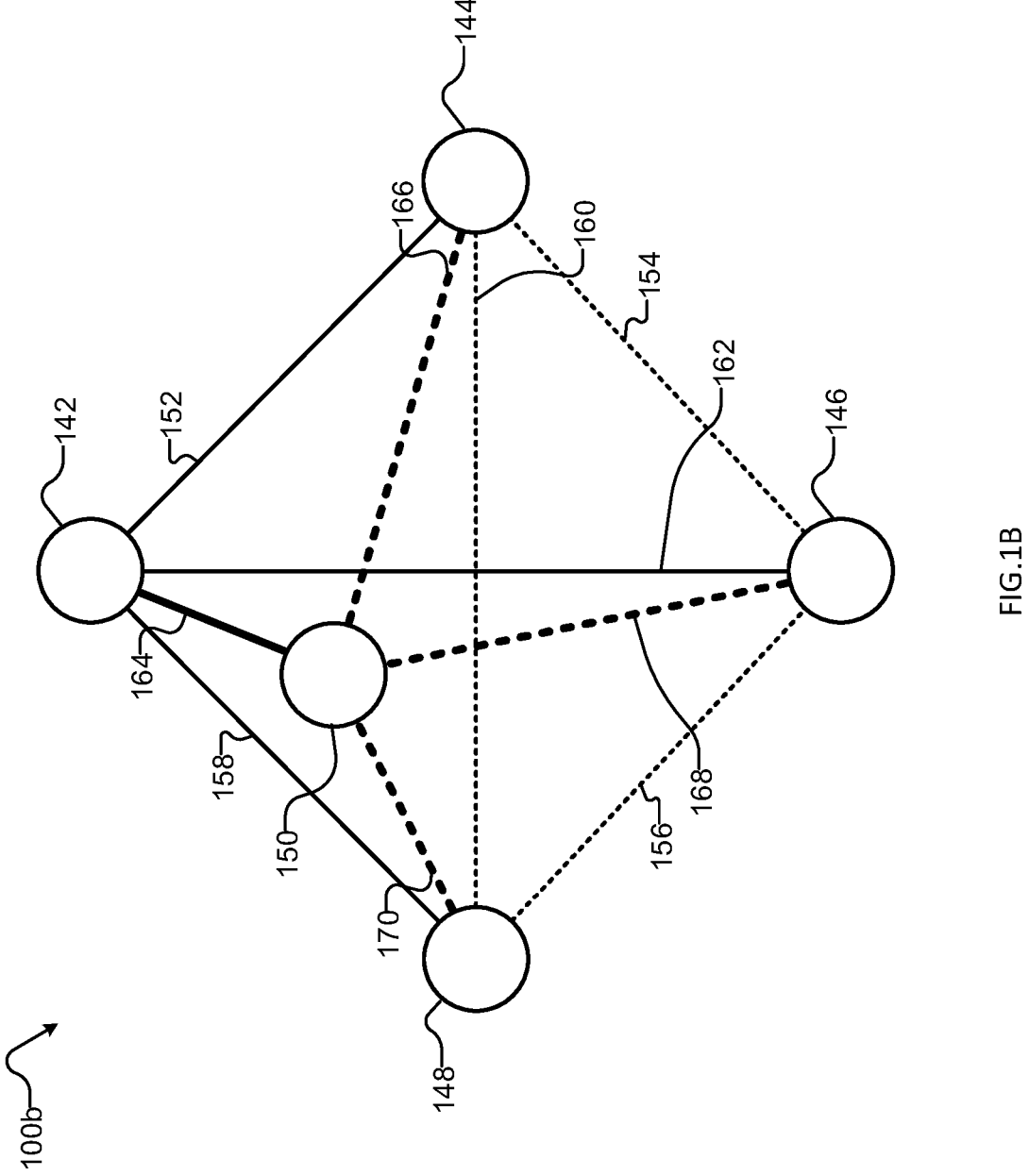
FIG. 1B is a schematic diagram of another example implementation of a 4-qubit even-parity stabilizer.

FIG. 1B is a schematic diagram of another example implementation of a 4-qubit even-parity stabilizer 100b. Stabilizer 100b includes four logical qubits 142, 144, 146, and 148. Stabilizer 100b is a simpler implementation of stabilizer 100a of FIG. 1A. In stabilizer 100b, auxiliary qubits 110 and 112 of FIG. 1A are replaced by a single auxiliary qubit 150.

In FIG. 1B, ferromagnetic couplings between qubits are indicated by solid lines, and anti-ferromagnetic couplings between qubits are indicated by dashed lines.

Stabilizer 100b includes a ferromagnetic (FM) coupling 152 between logical qubits 142 and 144, anti-ferromagnetic (AFM) couplings 154 and 156 between logical qubits 144 and 146, and 146 and 148, respectively, and an FM coupling 158 between logical qubits 148 and 142. Stabilizer 100b includes an AFM coupling 160 between logical qubits 144 and 148, and an FM coupling 162 between logical qubits 142 and 146.

Stabilizer 100b includes an FM coupling 164 between auxiliary qubit 150 and logical qubit 142, and AFM couplings 166, 168, and 170 between auxiliary qubit 150 and each of logical qubits 144, 146, and 148, respectively.

In the example implementation illustrated in FIG. 1B, a strength of couplings 164, 166, 168, and 170 between auxiliary qubit 150 and each of logical qubits 142, 144, 146, and 148, respectively, is twice the strength of couplings between each of auxiliary qubits 110 and 112, and logical qubits 102, 104, 106, and 108 of FIG. 1A, and twice the strength of each of couplings 152, 154, 156, 158, 160, and 162 between respective pairs of logical qubits 142, 144, 146, and 148.

The strength of couplings is illustrated in FIG. 1B by a thickness of lines representing couplings. For example, the line representing coupling 164 is twice as thick as the line representing coupling 152.

An interaction Hamiltonian for stabilizer 100b of FIG. 1B can be expressed as follows:

$$H_{int} \propto \sum_{i=1}^{4} \xi(i) \left[ 2\hat{\sigma}_i^z \hat{\sigma}_p^z + \sum_{j>i}^{4} \hat{\sigma}_i^z \hat{\sigma}_j^z \right]$$

where $\xi(1)=-1$ and $\xi(i)=+1$ otherwise.

Circuits with Qubits and 4-Qubit Stabilizer

A shortcoming of the LHZ architecture is that practical implementations of the architecture can require high connectivity between logical qubits. For example, in a two-dimensional square lattice of logical qubits, with a 4-qubit stabilizer (e.g., stabilizer 100b of FIG. 1B), each logical qubit can be communicatively coupled to 4 nearest-neighbor qubits, 4 next-nearest-neighbor qubits, and 4 auxiliary qubits, for a total of 12 couplings per logical qubit.

There are ways to reduce the required connectivity between logical qubits. Referring to FIG. 1B, the couplings between logical qubits 142, 144, 146, and 148, and the couplings between auxiliary qubit 150 and logical qubits 142, 144, 146, and 148 can be symmetric in magnitude. If this is the case, logical qubits 142, 144, 146, and 148, and auxiliary qubit 150 can be communicatively coupled by a single linear coupling device to realize pairwise couplings.

Figure 2:
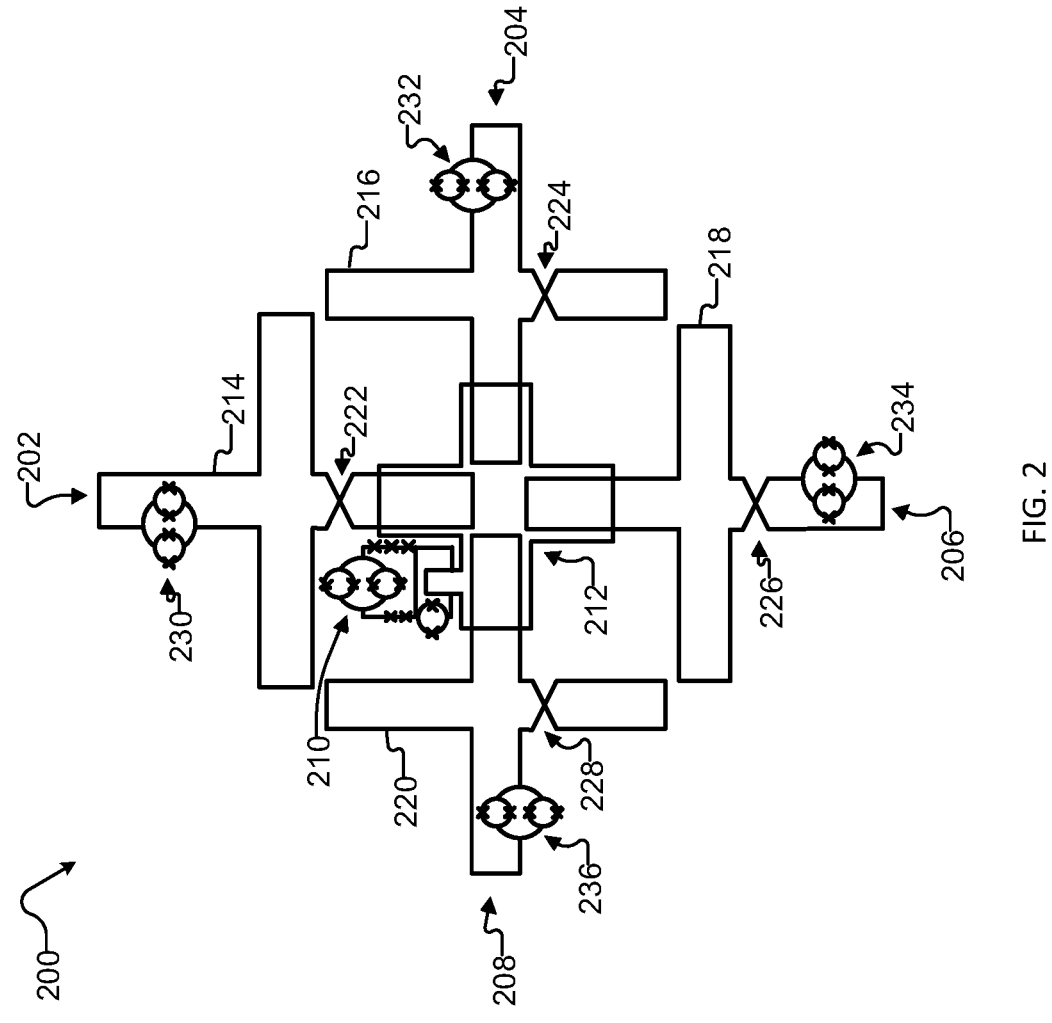
FIG. 2 is a schematic diagram of an example implementation of a circuit comprising the 4-qubit stabilizer of FIG. 1B.

FIG. 2 is a schematic diagram of an example implementation of a circuit 200 comprising 4-qubit stabilizer 100b of FIG. 1B. In circuit 200, four logical qubits 202, 204, 206, and 208, and an auxiliary qubit 210 are communicatively coupled by a single linear coupling device 212 to realize pairwise couplings.

Each of logical qubits 202, 204, 206, and 208 includes a superconducting loop 214, 216, 218, and 220, respectively. Each of superconducting loops 214, 216, 218, and 220 includes a material that is superconducting at or below a critical temperature.

Each of superconducting loops 214, 216, 218, and 220 includes a crossover 222, 224, 226, and 228, respectively. In the cross-shaped arrangement of circuit 200, crossovers 222, 224, 226, and 228 can change the sign of interactions with logical qubit 202 relative to those between logical qubits 204, 206, and 208, and auxiliary qubit 210.

A superconducting loop topologically formed by a 180° out-of-plane rotation of a portion of the superconducting loop is referred to in the present application as a superconducting loop with a crossover. Current through the superconducting loop on one side of the crossover flows in a clockwise direction around the loop, and current through the superconducting loop on the other side of the crossover flows in an anti-clockwise direction around the loop. The two segments of the superconducting loop that cross over each other are galvanically isolated from each other at the crossover.

An interaction Hamiltonian for the system can be expressed as follows:

$$\hat{H}_{int} = \frac{1}{2}\left[\sum_{i=1}^{4} M_{ci}\hat{I}_i^p + M_{cp}\hat{I}_p^p\right]\hat{I}_c^p$$

Provided the coupling device is linear with susceptibility $\chi_1{}^c$, then the persistent current operator for the coupling device can be expressed as follows:

$$\hat{I}_c^p = \chi_1^c\left[\sum_{i=1}^{4} M_{ci}\hat{I}_i^p + M_{cp}\hat{I}_p^p\right]$$

where $\hat{I}_i^p$ is the persistent current operator for the $i^{th}$ qubit. By combining equations, the interaction Hamilton $\hat{H}_{int}$ can be expressed as follows:

$$\hat{H}_{int} = \sum_{i=1}^{4}\left[M_{ci}M_{cp}\chi_1^c\left|I_q^p\right|\left|I_p^p\right|\hat{\sigma}_i^z\hat{\sigma}_p^z + \sum_{j>i}^{N} M_{ci}M_{cj}\chi_1^c\left|I_q^p\right|^2\hat{\sigma}_i^z\hat{\sigma}_j^z\right]$$

Choosing the following values can achieve a desired result:

$$-M_{c1}=M_{c2}=M_{c3}=M_{c4}=M_{cq}>0$$

and $$M_{cp}\left|I_p^p\right|=2M_{cp}\left|I_q^p\right|$$

Referring again to FIG. 2, each of superconducting loops 214, 216, 218, and 220 is interrupted by a compound-compound Josephson junction (CCJJ) 230, 232, 234, and 236, respectively.

In the example implementation of FIG. 2, auxiliary qubit 210 (also referred to in the present application as a parity-enforcing qubit) is communicatively coupled to coupling device 212 by a fully galvanic CJJ coupling device. In other implementations, auxiliary qubit 210 is a different kind of qubit. In other implementations, auxiliary qubit 210 has a different form of communicative coupling to coupling device 212.

See, for example, U.S. Pat. No. 10,068,180 for a description of a probe qubit. See, for example, International PCT Publication No. WO2019126396 (A1) fora description of a galvanic CJJ coupling device.

Circuit 200 can be tiled to generate an LHZ architecture with only four (4) couplings per logical qubit.

Circuits (such as circuit 200 of FIG. 2) that use a 4-bit parity enforcer can have advantages over circuits that use a conventional 4-local interaction. For example, a 4-bit parity enforcer can be implemented using a set of 2-local interactions configured to have a stronger effective 4-local interaction than a conventional 4-local interaction.

Josephson Parametric Amplifier

A parametric amplifier is generally used in the art to refer a device that amplifies a high-frequency input signal, for example, by sinusoidally varying a reactance of a circuit. A degenerate parametric amplifier is a phase-sensitive amplifier that can, at least in principle, amplify one of an in-phase and a quadrature component of a signal without introducing extra noise. A parametric amplifier can be based on a nonlinear inductance of a Josephson junction. Applications of a parametric amplifier can include quantum-limited amplification in the field of quantum information processing using superconducting circuits.

A Josephson parametric amplifier can include a superconducting transmission line resonator terminated by a DC SQUID (Superconducting Quantum Interference Device).

In one approach, a pump (also referred to in the present application as a drive) is used to modulate a current through a Josephson junction directly. In another approach (see, e.g., T. Yamamoto et al., FLUX-DRIVEN JOSEPHSON PARAMETRIC AMPLIFIER, arXiv:0808.1386v1), a pump is used to modulate a flux through the DC SQUID. A resonant frequency of the superconducting transmission line resonator can be controlled by a DC flux also applied to the DC SQUID. As the pump and an input signal are applied to different ports, and the pump frequency is twice the resonant frequency, it can be straightforward to separate an output signal from the pump.

Figure 3:
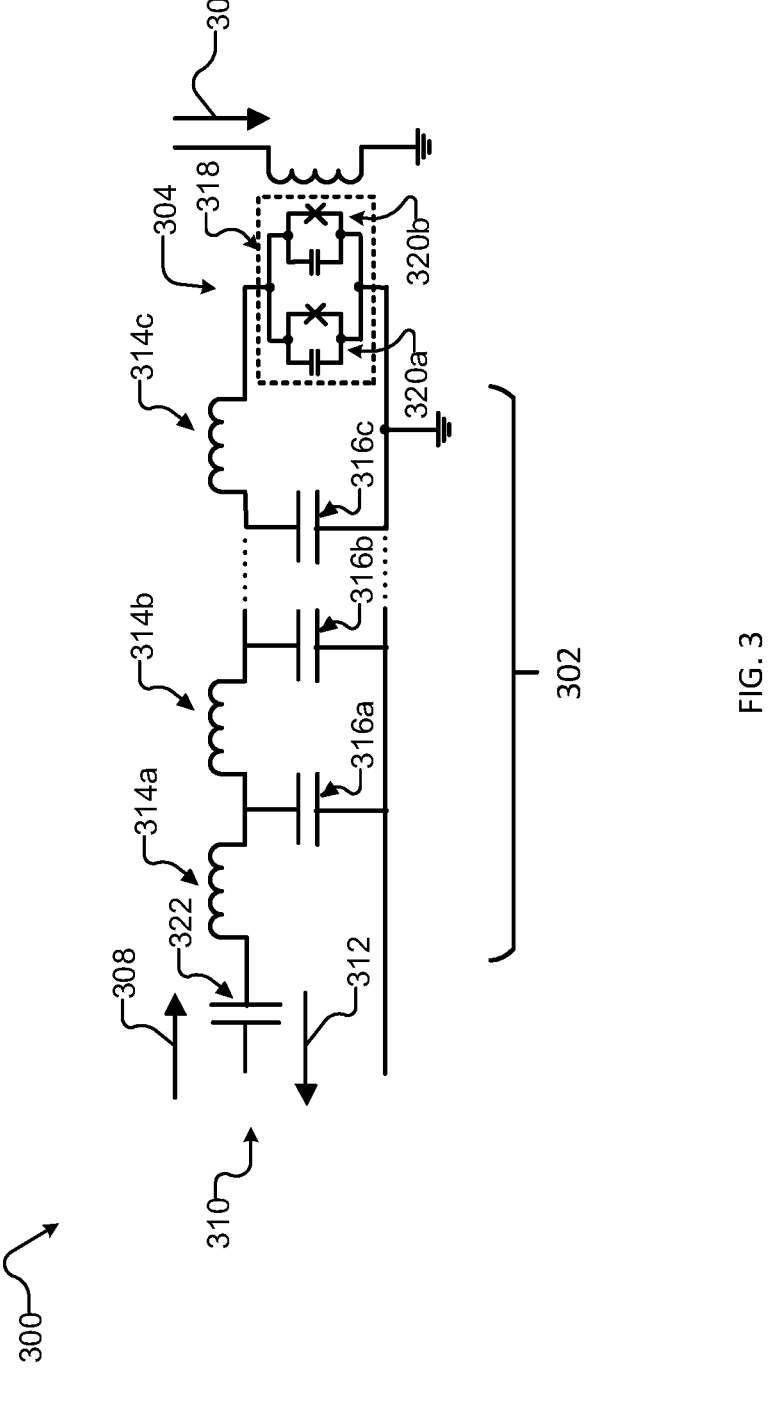
FIG. 3 is a schematic diagram of an example implementation of a Josephson parametric amplifier (JPA).

FIG. 3 is a schematic diagram of an example implementation of a Josephson parametric amplifier 300. JPA 300 includes a superconducting transmission line resonator 302 terminated by a DC SQUID 304. A pump 306 is used to modulate a current through DC SQUID 304.

An input signal 308 can be applied to a port 310 of superconducting transmission line resonator 302. An output signal 312 can be provided at port 310 of superconducting transmission line resonator 302. Superconducting transmission line resonator 302 includes inductances 314a, 314b, and 314c, and capacitances 316a, 316b, and 316c, each pair of inductances and capacitances (e.g., a pair formed of inductance 314a and capacitance 316a) forming an LC circuit. Superconducting transmission line resonator 302 may include additional LC circuits in series (not shown in FIG. 3).

DC SQUID 304 includes a compound Josephson junction (CJJ) 318 (shown in FIG. 3 using dashed lines). CJJ 318 includes Josephson junctions 320a and 320b. Each of Josephson junctions 320a and 320b can have a respective intrinsic capacitance (as shown in FIG. 3, but not called out in FIG. 3 for clarity).

Superconducting transmission line resonator 302 further includes coupling capacitance 322.

Quantum Annealing Platform Using JPAs

An Ising problem can be encoded in a network of two-photon-driven Kerr-nonlinear resonators (also referred to in the present application as KNRs). A single Ising spin can be mapped to two coherent states with opposite phases that can constitute a two-fold degenerate eigenspace of a two-photon-driven KNR in a frame rotating at the drive frequency.

In one circuit quantum electrodynamics (QED) implementation of a quantum annealer, a KNR is realized as a superconducting microwave resonator terminated by a flux-pumped SQUID (Superconducting Quantum Interference Device). A non-linear inductance of the flux-pumped SQUID can induce a Kerr-nonlinearity, and a two-photon drive can be created by flux-pumping the flux-pumped SQUID at twice a resonant frequency of the superconducting microwave resonator.

A Josephson parametric amplifier (JPA) can be similarly realized as a superconducting microwave resonator terminated by a flux-pumped SQUID, and so, in this context, a KNR can be considered as equivalent to a JPA. In one implementation, a SQUID loop of a JPA is driven by a flux pump with a tunable amplitude and frequency.

In some circuit implementations, a network of KNRs can be constructed using pairwise linear couplings, while still requiring only single-site drives.

Some optimization problems of interest can be represented using controllable long-range interactions between a large number of Ising spins, which can be a challenge to achieve in a hardware implementation. Long-range interactions may refer in the present application to interactions between non-adjacent nodes of a problem graph. One approach is to use a scheme (referred to in the present application as the LHZ scheme) that can map an Ising problem onto a graph with only local interactions. See, for example, Lechner W. et al., A QUANTUM ANNEALING ARCHITECTURE WITH ALL-TO-ALL CONNECTIVITY FROM LOCAL INTERACTIONS, Sci. Adv. 2015;1: e1500838 for a description of the LHZ scheme.

The LHZ scheme can be implemented, for example, by embedding physical spins in an eigenbasis of two-photon-driven KNRs. (An eigenbasis is a basis for a vector space consisting of eigenvectors.) As described above, a KNR can be realized as a superconducting microwave resonator terminated by a flux-pumped SQUID.

S. Pun et al., QUANTUM ANNEALING WITH ALL-TO-ALL CONNECTED NONLINEAR OSCILLATORS, Nature Communications (2017) describes an example physical realization that includes four JPAs coupled by a Josephson junction (JJ). A non-linearity of the JJ can induce four-body coupling between the four JPAs.

A quantum annealing platform can be built, for example, from groups of four JPAs interacting via a single Josephson junction (JJ). Each JPA in a group can have a different resonant frequency to the other three JPAs in the group. Each group of four JPAs and coupling JJ is referred to in the present application as a building block.

Figure 4:
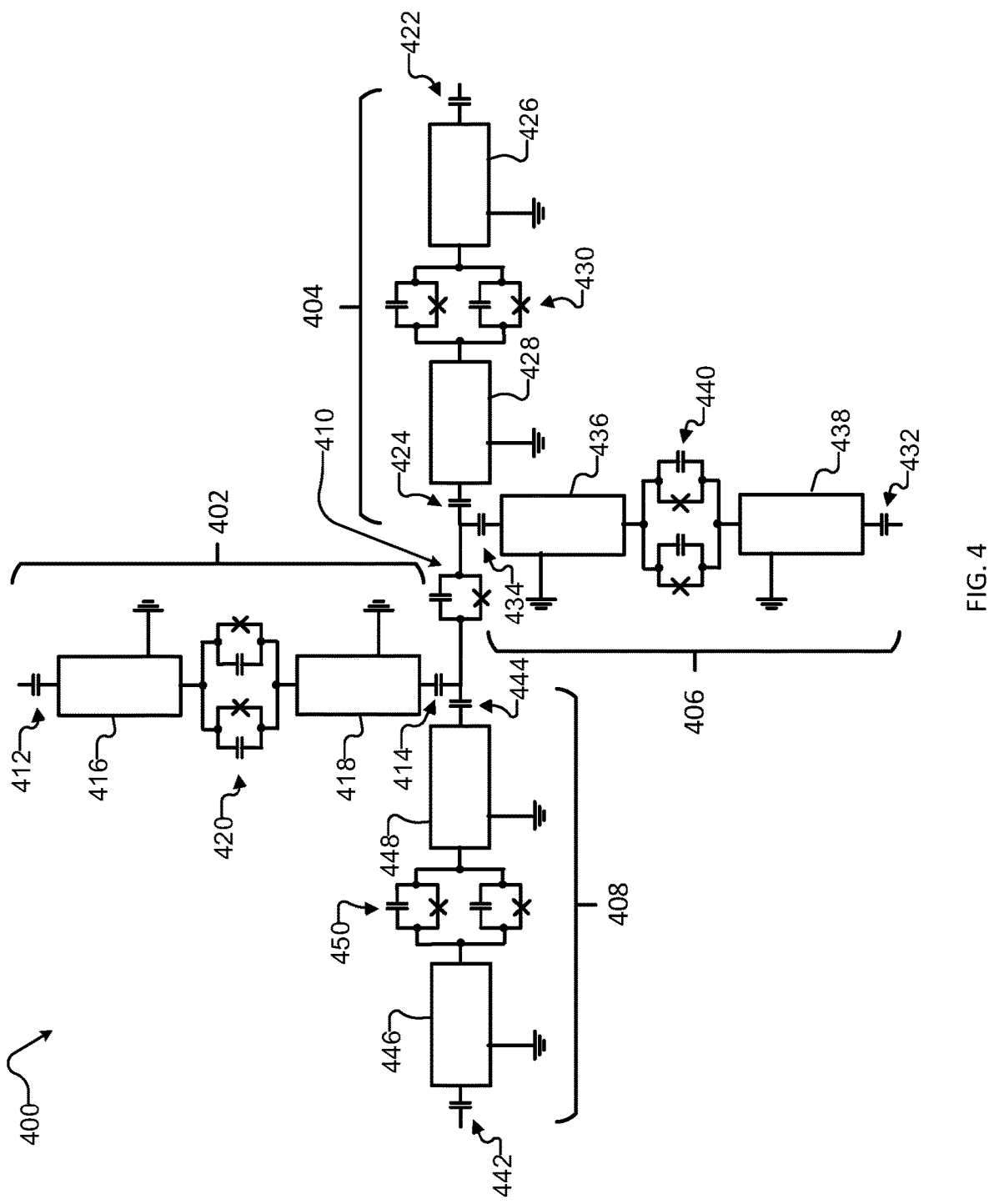
FIG. 4 is a schematic diagram of an example implementation of a building block that can be used to build a quantum annealing platform.

FIG. 4 is a schematic diagram of an example implementation of a building block 400 that can be used to build a quantum annealing platform. Building block 400 includes four JPAs 402, 404, 406, and 408, communicatively coupled by a JJ 410.

JPA 402 includes two coupling capacitors 412 and 414, and two resonators 416 and 418, communicatively coupled by a compound Josephson junction (CJJ) 420. JPA 404 includes two coupling capacitors 422 and 424, and two resonators 426 and 428, communicatively coupled by a CJJ 430. JPA 406 includes two coupling capacitors 432 and 434, and two resonators 436 and 438, communicatively coupled by a CJJ 440. JPA 408 includes two coupling capacitors 442 and 444, and two resonators 446 and 448, communicatively coupled by a CJJ 450.

Circuits with JPAs and 4-Qubit Stabilizer

While circuit 200 of FIG. 2 illustrates an implementation of an LHZ architecture using superconducting flux qubits, JPAs can be used in place of superconducting flux qubits.

Figure 5:
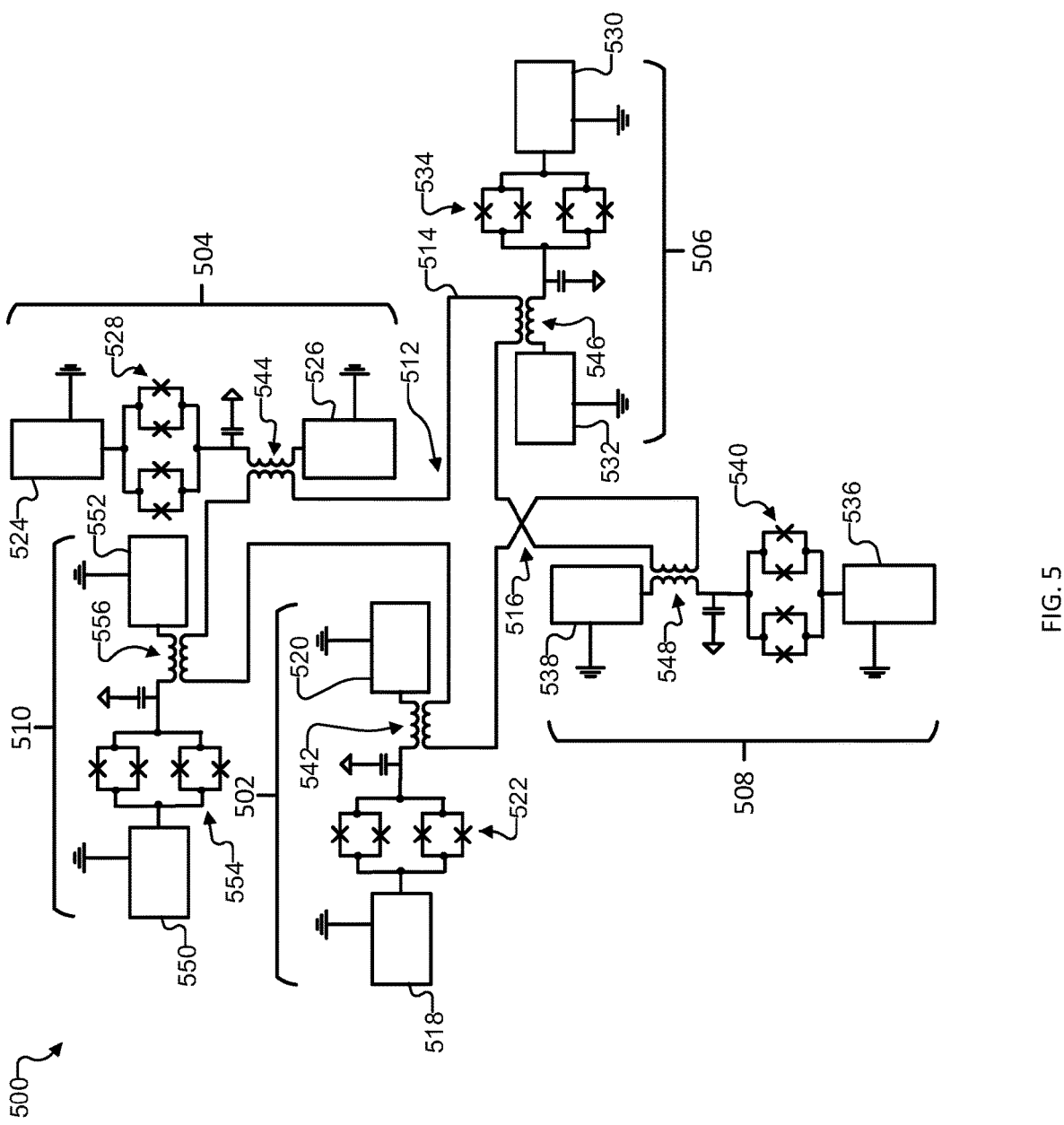
FIG. 5 is a schematic diagram of another example implementation of a building block that can be used to build a quantum annealing platform.

FIG. 5 is a schematic diagram of another example implementation of a building block 500 that can be used to build a quantum annealing platform. Building block 500 includes four JPAs 502, 504, 506, and 508, and an auxiliary JPA 510 are communicatively coupled by a single linear coupling device 512 to realize pairwise couplings. Coupling device 512 includes a superconducting loop 514. Superconducting loop 514 includes a material that is superconducting at or below a critical temperature. Superconducting loop 514 includes a crossover 516.

JPA 502 includes two resonators 518 and 520, communicatively coupled by a compound-compound Josephson junction (CCJJ) 522. JPA 504 includes two resonators 524 and 526, communicatively coupled by a CCJJ 528. JPA 506 includes two resonators 530 and 532, communicatively coupled by a CCJJ 534. JPA 508 includes two resonators 536 and 538, communicatively coupled by a CCJJ 540.

Coupling device 512 includes four inductive interfaces 542, 544, 546, and 548, each interface inductively communicatively coupled to a respective one of the four JPAs. Inductive interfaces 542, 544, 546, and 548 are shown in the example implementation of FIG. 5 as transformers that each include a pair of inductances, one inductance interrupting superconducting loop 514, and another inductance electrically communicatively coupled between one of the resonators of the JPA (e.g., resonator 520 of JPA 502) and the CCJJ of the JPA (e.g., CCJJ 522 of JPA 502). It can be beneficial to have the inductive coupling between coupling device 512 and each JPA at a position in the JPA where a respective current profile is strongest, or at least stronger, which is generally near the middle of the JPA.

In another implementation, inductive interfaces 542, 544, 546, and 548 include one inductance interrupting superconducting loop 514, and another inductance of an inner conductor of a coaxial transmission line of one of the resonators (e.g., resonator 520 of JPA 502).

Auxiliary JPA 510 includes two resonators 550 and 552, communicatively coupled by a compound-compound Josephson junction (CCJJ) 554. In the example implementation of FIG. 5, auxiliary JPA 510 (also referred to in the present application as a parity-enforcing JPA) is communicatively coupled to coupling device 512 by an inductive interface 556. In other implementations, auxiliary JPA 510 has a different form of communicative coupling to coupling device 512.

Scalable JPA Control

To realize a large-scale quantum annealing platform, it can be beneficial to implement a scalable JPA with scalable control biases, as described in the present application. The systems and methods described in the present application can also include advantageously replacing the single Josephson junction that couples the JPAs (e.g., JJ 410 of FIG. 4) by a compound Josephson junction (CJJ) or by a compound-compound Josephson junction (CCJJ), the CCJJ comprising a pair of CJJs arranged in parallel with each other.

A CCJJ can be more robust to the presence of variations in fabrication, and can be tuned to introduce junction asymmetry between constituent CJJs as needed. Each CJJ of the CCJJ can be biased, for example, by a combination of an analog DC current bias and a bias supplied by a DAC (digital to analog converter).

A resonant frequency of the superconducting microwave resonator of the JPA can be tuned using a combination of the analog DC current bias and the bias supplied by the DAC.

The systems and methods described in the present application include: a) a circuit operable to control the strengths of the X and Z terms of the effective Hamiltonian, and b) a circuit operable to facilitate spectroscopy of the JPA, for example, during calibration.

The systems and methods described in the present application include a scalable coupling for JPAs.

Figure 6:
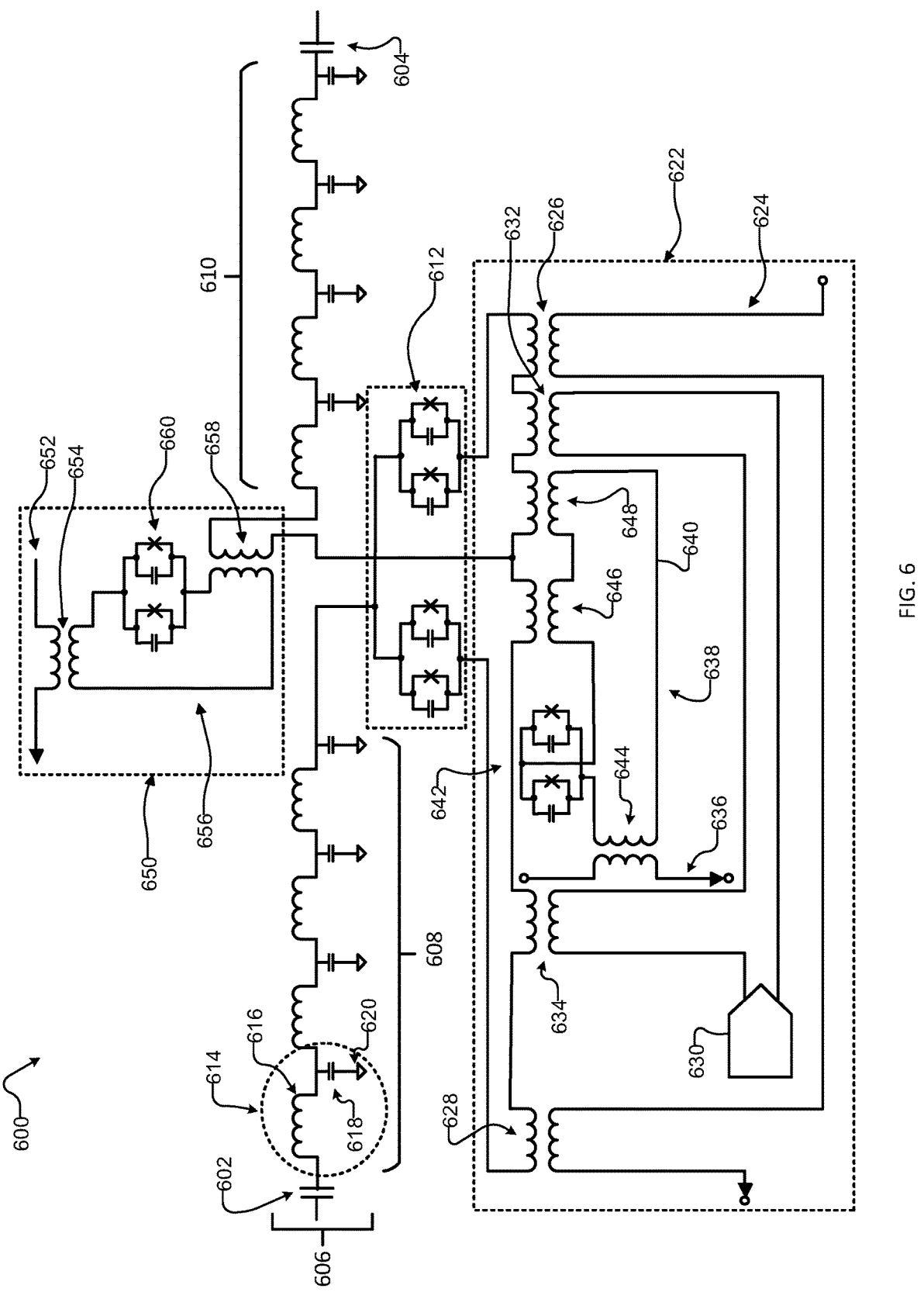
FIG. 6 is a schematic diagram of an example implementation of a circuit that includes a scalable JPA with scalable control biases.

FIG. 6 is a schematic diagram of an example implementation of a circuit 600 that includes a scalable JPA with scalable control biases. Circuit 600 includes coupling capacitances 602 and 604. The location of coupling capacitances 602 and 604 in circuit 600 also indicate where other devices and/or circuits can be communicatively coupled to circuit 600.

Circuit 600 includes a JPA 606. JPA 606 includes resonators 608 and 610, and a compound-compound Josephson junction (CCJJ) 612. Resonators 608 and 610 are both communicatively coupled to CCJJ 612. Each of resonators 608 and 610 includes two or more respective LC circuits (e.g., LC circuit 614, only one called out in FIG. 6 for clarity) electrically communicatively coupled in series with each other. LC circuit 614 includes an inductance 616, and a capacitor 618 that is electrically communicatively coupled to a ground terminal 620.

Circuit 600 includes a control circuit 622 (also referred to in the present application as CNTL-XZ 622). CNTL-XZ 622 can be used to control strengths of X-terms and Z-terms of an effective Hamiltonian via parametric and resonant drives at angular frequencies $\omega_p = 2\omega_r - \delta_0(t)$ and $\omega_r$, respectively. The function $\delta_0(t)$ is referred to in the present application as a de-tuning function, and can be a function of time. The de-tuning function can cause a resonator to be "off-resonance". The resonator can be brought into resonance during annealing, for example. The de-tuning function can define an annealing schedule. The de-tuning function can be a monotonic function or a non-monotonic function.

CJJ 220 of JPA 202 of FIG. 2 is advantageously replaced by CCJJ 612 in circuit 600 of FIG. 6. CCJJ 612 can be used a) to compensate for variations in fabrication of constituent Josephson junctions, and b) to intentionally introduce junction asymmetry as required for operation and/or calibration of circuit 600.

CCJJ 612 can be tuned by a combination of an analog DC current bias 624 by a first pair of inductive interfaces 626 and 628, and a digital-to-analog converter (DAC) 630 by a second pair of inductive interfaces 632 and 634.

A microwave drive 636 is communicatively coupled to CCJJ 612 via a tunable mutual inductance 638. Tunable mutual inductance 638 includes a superconducting loop 640 interrupted by a CJJ 642. Tunable mutual inductance 638 has an inductive interface 644 to microwave drive 636, and a third pair of inductive interfaces 646 and 648 to CCJJ 612.

In some implementations, each pair of the first pair of inductive interfaces 626 and 628, the second pair of inductive interfaces 632 and 634, and the third pair of inductive interfaces 646 and 648 may be replaced by a respective single inductive interface (also referred to in the present application as a transformer). A benefit of having a pair of inductive interfaces rather than a single inductive interface is that they can be mirror-symmetric with respect to CCJJ 612.

In some implementations, at least one pair of the first pair of inductive interfaces 626 and 628, the second pair of inductive interfaces 632 and 634, and the third pair of inductive interfaces 646 and 648 is mirror-symmetric with respect to CCJJ 612. Mirror-symmetry of inductive interfaces in a pair of inductive interfaces can eliminate, or at least reduce, the magnitude of unbalanced phases and/or unintended biases.

A function of tunable mutual inductance 638 is to facilitate per-device adjustment of a coupling strength between microwave drive 636 and a target device. Per-device adjustment can advantageously be used to compensate for variations in fabrication and/or impedance mismatches. Tunable mutual inductance 638 can have a combination of an analog current bias and a bias supplied by a DAC (not shown in FIG. 6) applied to CJJ 642.

Circuit 600 includes a control circuit 650 (also referred to in the present application as CNTL-X). CNTL-X includes a microwave drive 652 inductively coupled via interface 654 to a tunable mutual inductance 656 that is inductively coupled via interface 658 to CCJJ 612. Tunable mutual inductance 656 includes a CJJ 660. Tunable mutual inductance 656 can have a combination of an analog current bias and a bias supplied by a DAC (not shown in FIG. 6) applied to CJJ 660.

The above described method(s), process(es), or technique(s) could be implemented by a series of processor readable instructions stored on one or more non-transitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) may be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications may be made without departing from the spirit and scope of the disclosure, as will be recognized by those skilled in the relevant art. The teachings provided herein of the various implementations may be applied to other methods of quantum computation, not necessarily the exemplary methods for quantum computation generally described above.

The various implementations described above may be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to U.S. Patent Application No. 63/001,014, filed Mar. 27, 2020.

These and other changes may be made to the implementations in light of the above-detailed description. In general, in the following claims, the terms used should not be construed to limit the claims to the specific implementations disclosed in the specification and the claims but should be construed to include all possible implementations along with the full scope of equivalents to which such claims are entitled. Accordingly, the claims are not limited by the disclosure.

The invention claimed is:

1. A quantum processor comprising a first, a second, a third, and a fourth Josephson parametric amplifier, wherein the first, the second, the third, and the fourth parametric amplifiers are communicatively coupled to one another by a 4-qubit even- parity stabilizer, the 4-qubit even-parity stabilizer comprising:

a superconducting loop, the superconducting loop which includes a material that is superconducting at or below a critical temperature, the superconducting loop which includes a crossover;

a first, a second, a third, and a fourth inductance of the superconducting loop, each of the first, the second, the third, and the fourth inductance inductively communicatively coupled to an inductance of a respective Josephson parametric amplifier; and a parity-enforcing Josephson parametric amplifier, wherein the parity-enforcing Josephson parametric amplifier is communicatively coupled to the superconducting loop.

2. The quantum processor of claim 1, wherein each of the first, the second, the third, and the fourth Josephson parametric amplifiers comprises a respective pair of superconducting microwave resonators, each superconducting microwave resonator of the respective pair of superconducting microwave resonators communicatively coupled to each other by a compound-compound Josephson junction.

3. The quantum processor of claim 2, wherein each of the first, the second, the third and the fourth Josephson parametric amplifiers comprises:

a respective compound-compound Josephson junction; and a respective first control circuit communicatively coupled to the respective compound-compound Josephson junction of the first, the second, the third and the fourth Josephson parametric amplifiers, wherein each respective first control circuit comprises:

an analog direct current (DC current) bias, the analog DC current bias communicatively coupled to the respective compound-compound Josephson junction of the first, the second, the third and the fourth Josephson parametric amplifiers;

a digital-to-analog converter (DAC), the DAC communicatively coupled to the respective compound-compound Josephson junction of the first, the second, the third and the fourth Josephson parametric amplifiers; and a respective first microwave drive communicatively coupled to a respective first tunable mutual inductance, wherein the respective first tunable mutual inductance is communicatively coupled to the respective compound-compound Josephson junction of the first, the second, the third and the fourth Josephson parametric amplifiers.

4. The quantum processor of claim 3, wherein the respective first tunable mutual inductance of each of the respective first control circuit is inductively communicatively coupled to the respective compound-compound Josephson junction of the first, the second, the third and the fourth Josephson parametric amplifiers and each of the analog DC current bias and each of the DAC of the respective first control circuit are inductively communicatively coupled to the respective compound-compound Josephson junction of the first, the second, the third and the fourth Josephson parametric amplifiers.

5. The quantum processor of claim 3, wherein each respective first control circuit is operable to control strengths of X-terms and Z-terms of an effective Hamiltonian via a resonant drive at a first angular frequency, and via a parametric drive at a second angular frequency, the second angular frequency equal to a difference between twice the first angular frequency and a time-dependent de-tuning frequency.

6. The quantum processor of claim 3, wherein each of the first, the second, the third and the fourth Josephson parametric amplifiers further comprises a respective second control circuit, each respective second control circuit comprising a respective second microwave drive communicatively coupled to a respective second tunable mutual inductance, wherein each respective second tunable mutual inductance is communicatively coupled to the respective compound-compound Josephson junction of the first, the second, the third and the fourth Josephson parametric amplifiers.

7. The quantum processor of claim 6, wherein each respective second tunable mutual inductance of the respective second control circuit is inductively communicatively coupled to the respective compound-compound Josephson junction of the first, the second, the third and the fourth Josephson parametric amplifiers.

8. The quantum processor of claim 6, wherein each respective first and second tunable mutual inductance comprises a superconducting loop interrupted by a compound Josephson junction.

9. The quantum processor of claim 2, wherein each of the superconducting microwave resonators in the respective pair of superconducting resonators of the first, the second, the third, and the fourth Josephson parametric amplifiers is one of: a coaxial transmission line resonator, and a ladder circuit comprising a plurality of inductor-capacitor (LC) circuits electrically communicatively coupled in series with one another.

* * * * *